(12) United States Patent
Ohara et al.

(10) Patent No.: US 12,500,603 B2
(45) Date of Patent: Dec. 16, 2025

(54) INTEGRATOR AND DELTA-SIGMA MODULATOR

(71) Applicant: Asahi Kasei Microdevices Corporation, Tokyo (JP)

(72) Inventors: Kazuma Ohara, Tokyo (JP); Yuichi Miyahara, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 97 days.

(21) Appl. No.: 18/666,766

(22) Filed: May 16, 2024

(65) Prior Publication Data
US 2024/0421829 A1 Dec. 19, 2024

(30) Foreign Application Priority Data

Jun. 14, 2023 (JP) .................................. 2023-097519

(51) Int. Cl.
*H03M 3/00* (2006.01)
*H03M 1/40* (2006.01)

(52) U.S. Cl.
CPC ........... *H03M 3/464* (2013.01); *H03M 1/403* (2013.01)

(58) Field of Classification Search
CPC ............................... H03M 3/464; H03M 1/403
See application file for complete search history.

(56) References Cited

U.S. PATENT DOCUMENTS

| | | | |
|---|---|---|---|
| 7,634,040 B1 * | 12/2009 | Yang | H03L 7/091 375/376 |
| 9,419,643 B2 * | 8/2016 | Watanabe | H03M 3/464 |
| 9,838,031 B2 * | 12/2017 | Dong | H03M 3/422 |
| 2008/0074302 A1 | 3/2008 | Akizuki | |
| 2008/0198050 A1 | 8/2008 | Akizuki | |
| 2013/0057421 A1 * | 3/2013 | Aruga | H03M 3/02 341/143 |
| 2013/0099955 A1 | 4/2013 | Shaeffer | |
| 2018/0343013 A1 * | 11/2018 | Breems | H03M 3/496 |
| 2019/0199369 A1 | 6/2019 | Katayama | |
| 2020/0153451 A1 * | 5/2020 | Zhou | H03M 3/464 |
| 2021/0091729 A1 * | 3/2021 | Akutagawa | H03G 3/30 |

FOREIGN PATENT DOCUMENTS

JP 2019118100 A 7/2019

* cited by examiner

*Primary Examiner* — Mohamed Barakat

(57) ABSTRACT

There is provided an integrator including: a first order delay unit which outputs an output signal obtained by delaying a signal in accordance with an input signal; a first feedback unit which generates a first feedback signal in accordance with the output signal; a second feedback unit which generates a second feedback signal in accordance with the output signal; an addition and subtraction unit which adds and subtracts the first feedback signal and the second feedback signal, respectively, to and from the input signal, for an input to the delay unit; and a control unit which causes the second feedback unit to operate as a delay circuit during the first period, and causes the second feedback unit to operate as a gain circuit having a gain smaller than 0 during the second period.

20 Claims, 16 Drawing Sheets

INTEGRATOR AND DELTA-SIGMA MODULATOR

The contents of the following patent application(s) are incorporated herein by reference: NO. 2023-097519 filed in JP on Jun. 14, 2023

BACKGROUND

1. Technical Field

The present invention relates to an integrator and a delta-sigma modulator.

2. Related Art

In the related art, as a method to achieve high resolution with low power consumption, an incremental delta-sigma modulator is known to operate as an integrator in which a first order feedback coefficient is 1 until a predetermined period has elapsed; and operate as an amplifier in which the first order feedback coefficient is greater than 1 after the predetermined period has elapsed (for example, refer to Patent Document 1).

PRIOR ART DOCUMENT

Patent Document

Patent Document 1: Japanese Patent Application Publication No. 2019-118100

DESCRIPTION OF EXEMPLARY EMBODIMENTS

Hereinafter, embodiments of the present invention will be described. However, the following embodiments are not for limiting the invention according to the claims. In addition, not all of the combinations of features described in the embodiments are essential to the solution of the invention.

Figure 1:
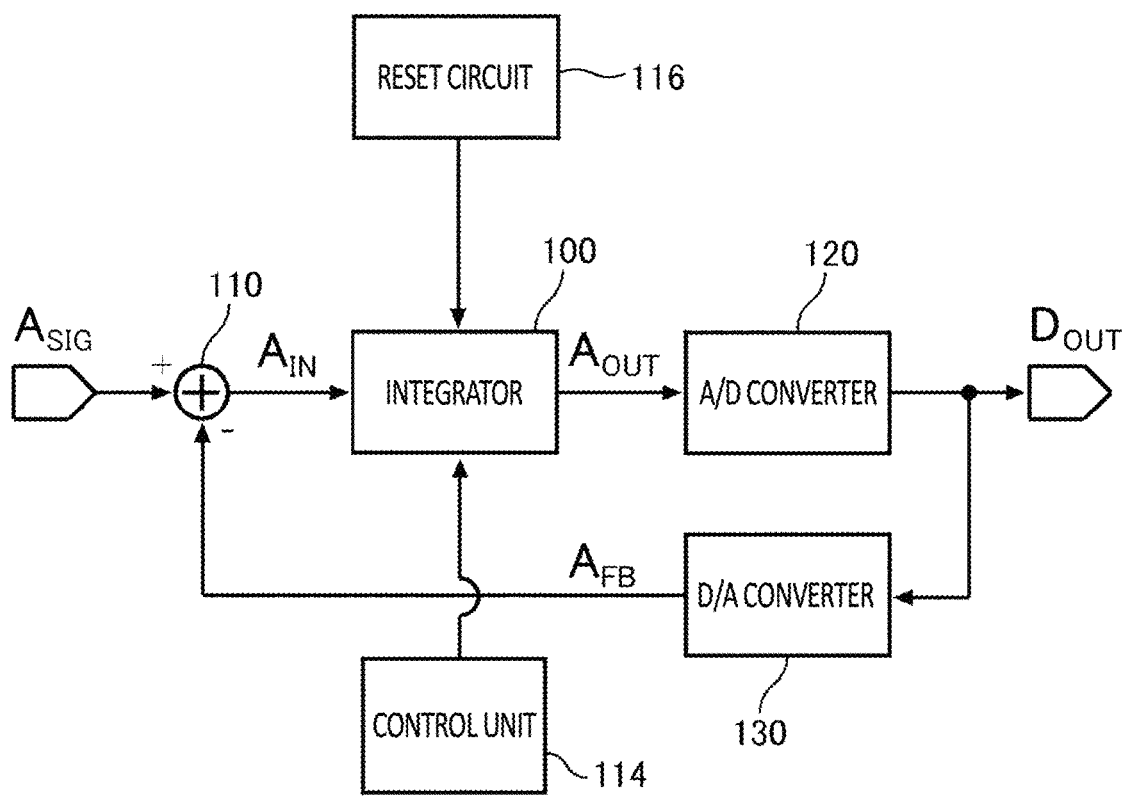
FIG. 1 shows a configuration example of a delta-sigma modulator 200 which uses an integrator 100 according to an embodiment of the present invention.

FIG. 1 shows a configuration example of a delta-sigma modulator 200 which uses an integrator 100 according to an embodiment of the present invention. The delta-sigma modulator 200 is an example of a circuit which uses the integrator 100, and the circuit in which the integrator 100 is provided is not limited to the delta-sigma modulator 200.

The delta-sigma modulator 200 converts an analog signal $A_{SIG}$ that is input, into a digital signal $D_{OUT}$. The delta-sigma modulator 200 is, as an example, an incremental AD converter which resets an integral value of the integrator 100 to an initial value, for each cycle of an AD conversion. In the delta-sigma modulator 200, an AD conversion period and a reset period are alternately repeated.

The AD conversion period in the delta-sigma modulator 200 of the present example has a first period and a second period. The second period is a period after the first period. That is, operations in the delta-sigma modulator 200 are repeated for the first period, the second period, and the reset period in order. The integrator 100 of the present example operates as integrators in which first order feedback coefficients are 1 during the first period, and operates as an integrator in which a first order feedback coefficient is greater than 1 during the second period. This makes it possible for the integrator 100 to have high resolution.

The delta-sigma modulator 200 shown in FIG. 1 includes an addition and subtraction unit 110, the integrator 100, an analog-to-digital converter (referred to as an AD conversion unit 120), and a digital-to-analog converter (referred to as a DA conversion unit 130). The delta-sigma modulator 200 may further include a control unit 114 and a reset circuit 116. The addition and subtraction unit 110 subtracts a feedback signal $A_{FB}$ from the analog signal $A_{SIG}$ to generate an input signal $A_{IN}$. The feedback signal $A_{FB}$ and the input signal $A_{IN}$ in the present example are analog signals.

The integrator 100 generates an output signal $A_{OUT}$ obtained by integrating the input signal $A_{SIG}$. The integrator 100 may be an analog integrator. The control unit 114 controls the integrator 100. The control unit 114 of the present example causes the integrator 100 to perform integration operations that are different between the first period and the second period described above. The reset circuit 116 resets a value of the output signal $A_{OUT}$ that is output by the integrator 100, to the initial value for each time when the AD conversion period ends.

The AD conversion unit 120 converts the output signal $A_{OUT}$ into the digital signal $D_{OUT}$. The AD conversion unit 120 may quantize the output signal $A_{OUT}$ at a timing in accordance with a clock signal that is supplied from the outside. The AD conversion unit 120 may output the digital signal $D_{OUT}$ of a binary value. For example, the AD conversion unit 120 is a one bit quantizer which outputs one pulse when the value of the output signal $A_{OUT}$ is greater than or equal to a set value, and does not output the pulse when the value of the output signal $A_{OUT}$ is smaller than the set value. In this case, a magnitude of the analog signal $A_{SIG}$ is converted into a density of the pulse during the AD conversion period. In another example, the AD conversion unit 120 may output the digital signal $D_{OUT}$ of a multiple value which is a ternary or greater value.

The DA conversion unit 130 generates the feedback signal $A_{FB}$ in accordance with the digital signal $D_{OUT}$ output by the AD conversion unit 120. The feedback signal $A_{FB}$ is, for example, an analog signal having an amplitude in accordance with the value of the digital signal $D_{OUT}$. When the AD conversion unit 120 is the one bit quantizer, the DA conversion unit 130 may generate the feedback signal $A_{FB}$ having a preset magnitude for each time when the AD conversion unit 120 outputs a pulse.

Figure 2:
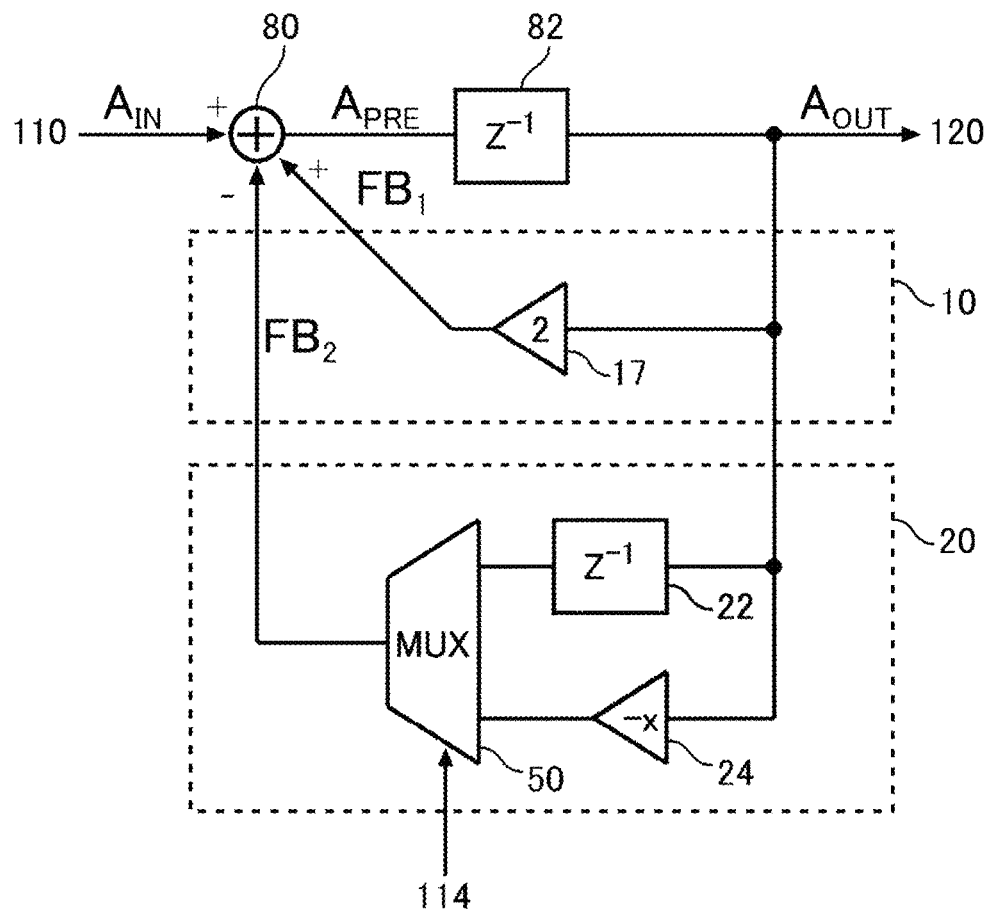
FIG. 2 is a diagram showing a configuration example of the integrator 100.

FIG. 2 is a diagram showing a configuration example of the integrator 100. The integrator 100 has a delay unit 82, a first feedback unit 10, a second feedback unit 20, and an addition and subtraction unit 80. The delay unit 82 generates the output signal $A_{OUT}$ obtained by delaying a signal $A_{PRE}$ in accordance with the input signal $A_{IN}$. The delay unit 82 is a first order delay circuit in which a maximum order of a transfer coefficient is one.

The delay unit 82 in the present example generates a delay of one cycle of the clock signal that is supplied. The respective clock signals described in the present specification have a cycle in common, unless otherwise noted. The addition and subtraction unit 80 generates the signal $A_{PRE}$ obtained by adding a first feedback signal $FB_1$ to the input signal $A_{IN}$, and subtracting a second feedback signal $FB_2$ from the input signal $A_{IN}$.

The first feedback unit 10 generates the first feedback signal $FB_1$ in accordance with the output signal $A_{OUT}$. The first feedback unit 10 may include a gain circuit 17 which amplifies the output signal $A_{OUT}$ with a predetermined gain. The gain in the gain circuit 17 of the present example is two.

The second feedback unit 20 generates the second feedback signal $FB_2$ in accordance with the output signal $A_{OUT}$. The control unit 114 shown in FIG. 1 causes the second feedback unit 20 to operate as a delay circuit during the first period, and causes the second feedback unit 20 to operate as a gain circuit having a gain smaller than 0 during the second period. That is, during the second period, the second feedback unit 20 operates as a gain circuit having a negative gain.

The second feedback unit 20 of the present example has a delay circuit 22, a gain circuit 24, and a selection unit 50. The delay circuit 22 delays and outputs the output signal $A_{OUT}$. A delay time of the delay circuit 22 may be the same as a delay time of the delay unit 82. The delay circuit 22 of the present example delays the output signal $A_{OUT}$, by one cycle of the clock signal, for the output. The gain circuit 24 amplifies the output signal $A_{OUT}$ by a predetermined gain $-x$ for the output. The x is a value greater than 0, and may be a value greater than or equal to 1, or may be a value greater than or equal to 2.

The selection unit 50 performs a selection regarding whether to cause the second feedback unit 20 to operate as the delay circuit 22, or to operate as the gain circuit 24.

The selection unit 50 may be a circuit which selects and outputs either the output of the delay circuit 22 or the output of the gain circuit 24.

In the example of FIG. 2, the delay circuit 22 and the gain circuit 24 are shown as separate circuits; however, the delay circuit 22 and the gain circuit 24 may have some or all of the elements in common. The selection unit 50 may perform, by controlling these elements, the selection regarding whether to cause the second feedback unit 20 to operate as the delay circuit 22, or to operate as the gain circuit 24. it is possible to reduce a circuit size of the second feedback unit 20, by the delay circuit 22 and the gain circuit 24 having at least parts in common.

The addition and subtraction unit 80 adds and subtracts the first feedback signal $FB_1$ and the second feedback signal $FB_2$, respectively, to and from the input signal $A_{IN}$, for the input to the delay unit 82. The addition and subtraction unit 80 adds the first feedback signal $FB_1$ to the input signal $A_{IN}$. The addition and subtraction unit 80 of the present example subtracts the second feedback signal $FB_2$ from the input signal $A_{IN}$.

During the first period in which the second feedback unit 20 functions as the delay circuit 22, the integrator 100 operates as the integrators in which the first order feedback coefficients are 1. During the second period in which the second feedback unit 20 functions as the gain circuit 24, the integrator 100 operates as the integrator in which the first order feedback coefficient is greater than 1. In the example of FIG. 2, the feedback coefficient during the second period is 1+x. This makes it possible for the integrator 100 to have high resolution.

The output signal $A_{OUT}$ during the first period is expressed by Math 1.

$$A_{OUT} = \frac{z^{-1}}{(1-z^{-1})^2} A_{IN} \quad \text{(Math. 1)}$$

The output signal $A_{OUT}$ during the second period is expressed by Math 2.

$$A_{OUT} = \frac{z^{-1}}{1-(2+x)z^{-1}} A_{IN} \quad \text{(Math. 2)}$$

Each component of the integrator 100 operates for each time when the pulse of the clock signal is input. When the number of pulses of the clock signal that is input during the first period is set as m, a transfer function of the integrator 100 during the first period can be transformed as shown in Math 3.

$$\frac{z^{-1}}{(1-z^{-1})^2} = \frac{m(m-1)}{2} \quad \text{(Math. 3)}$$

As shown in Math 3, the integrator 100 during the first period amplifies the input signal $A_{IN}$ according to the square of the number m of pulses of the clock signal that is input. An amplification factor of the integrator 100 during the first period is comparatively small.

An error may occur in the integrator 100. The error in the integrator 100 occurs by the output of the gain circuit 24, the input of the delay circuit 22, or the like. The error occurs by a transfer error of an electric charge or the like at a time of the operation of the integrator 100. When the error occurs in the integrator 100, the error increases for each time when the integrator 100 operates in accordance with the clock signal. In the integrator 100 of the present example, the output of the delay circuit 22 is subtracted from the input signal $A_{IN}$ during the first period. Therefore, even though the error occurs in the integrator 100, the component of the error is subtracted by the second feedback signal $FB_2$, and the amplification of the error can be suppressed.

When the number of pulses of the clock signal that is input during the second period is set as n, a transfer function of the integrator 100 during the second period can be transformed as shown in Math 4.

$$\frac{z^{-1}}{1-(2+x)z^{-1}} = \frac{(2+x)^n - 1}{(2+x) - 1} \quad \text{(Math. 4)}$$

As shown in Math 4, the integrator 100 during the second period amplifies the input signal $A_{IN}$ exponentially according to the number n of pulses of the clock signal. Therefore, it is possible to amplify the input signal $A_{IN}$ during the second period by an amplification factor higher than that during the first period. Note that during the second period, when the error occurs in the integrator 100, the error is also exponentially amplified. Therefore, unless the number of pulses of the clock signal that is input during the second period is limited, the error becomes too great.

In the integrator 100 of the present example, the first period is provided in addition to the second period. In this manner, even when the number n of pulses during the second period is limited, and the second period can be provided only in a part of the AD conversion period, it is possible to amplify the input signal $A_{IN}$ during the first period. Further, by the first period having elapsed, the operation of the integrator 100 becomes comparatively stable during the second period, and the occurrence of the error is suppressed. With the integrator 100, it is possible to suppress the amplification of the error and amplify the input signal $A_{IN}$ during the first period; and to amplify the input signal $A_{IN}$ by a high amplification factor during the second period. By using the multiplications of the transfer functions shown in Math 3 and Math 4, the output signal $A_{OUT}$ of the integrator 100 is expressed as in Math 5.

$$A_{OUT} = \frac{m(m-1)}{2} * \frac{(2+x)^n - 1}{(2+x) - 1} A_{IN} \quad \text{(Math. 5)}$$

As shown in Math 5, by the one integrator 100, it is possible to realize a second order integrator which amplifies the input signal AN according to the square of the number m of pulses, and an integrator which exponentially amplifies the input signal $A_{IN}$ according to the number n of pulses.

Figure 3:
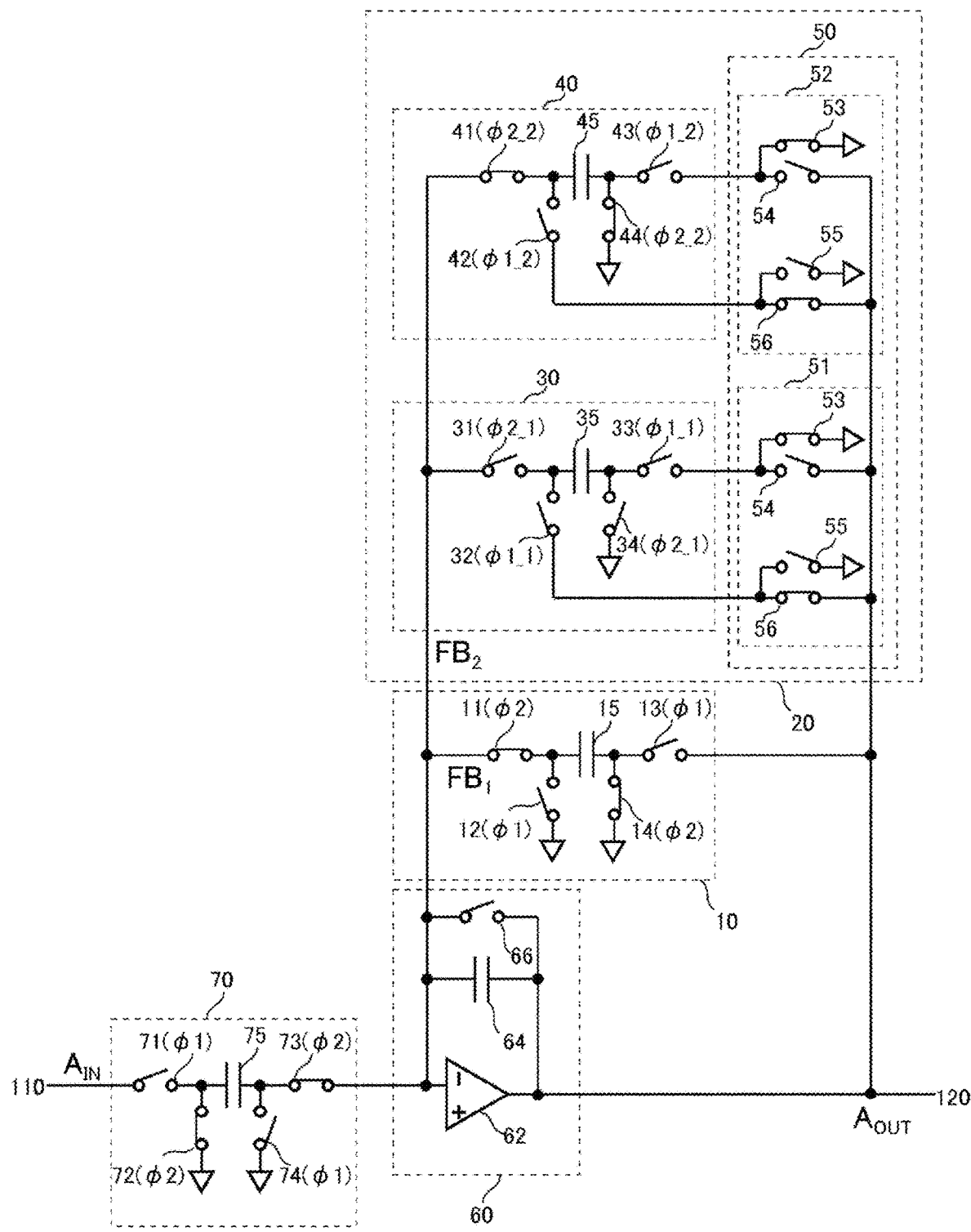
FIG. 3 is a diagram showing a specific configuration example of the integrator 100.

FIG. 3 is a diagram showing a specific configuration example of the integrator 100. The integrator 100 has an amplifier 62. The amplifier 62 shown in FIG. 3 is an amplifier of a differential input. An input of the amplifier 62 on a positive side may be connected to a reference potential. When both of the input and an output of the amplifier 62 are differential, a configuration other than the amplifier 62 shown in FIG. 3 may be provided on the positive side of the amplifier 62 as well.

The integrator 100 of the present example has a switched capacitor 70, an amplifier circuit 60, the first feedback unit 10, and the second feedback unit 20. The switched capacitor 70 and the amplifier circuit 60 function as the addition and subtraction unit 80 and the delay unit 82 shown in FIG. 2.

The switched capacitor 70 has a capacitor 75, a switch 71, a switch 72, a switch 73, and a switch 74. On and off states of each switch are controlled by a signal ɸk (k indicates one integer or two integers connected by an underscore). In the drawing attached to the present specification, a plurality of switches for which the same signal ɸk is shown in parentheses after the reference signs and numerals, are in the same on and off states. In the present example, when the signal ɸk indicates a H level, the corresponding switch is in an on state, and when the signal ɸk indicates a L level, the corresponding switch is in an off state.

The switch 71 and a switch 72 are connected to one electrode of the capacitor 75. The switch 71 performs switching regarding whether to apply the input signal $A_{IN}$ to the electrode of the capacitor 75. The switch 72 performs switching regarding whether to connect the electrode of the capacitor 75 to the reference potential. The switch 73 and the switch 74 are connected to the other electrode of the capacitor 75. The switch 73 performs switching regarding whether to connect the other electrode of the capacitor 75 to the amplifier circuit 60. The switch 74 performs switching regarding whether to connect the other electrode of the capacitor 75 to the reference potential. The reference potential is, for example, 0 V.

The switch 71 and the switch 74 are controlled by a signal ɸ1. The switch 72 and the switch 73 are controlled by a signal ɸ2. When the signal ɸ1 indicates the on state and the signal ɸ2 indicates the off state, the capacitor 75 is charged by the input signal $A_{IN}$. When the signal ɸ1 indicates the off state and the signal ɸ2 indicates the on state, a voltage of the capacitor 75 is applied to the amplifier circuit 60. For example, the signal ɸ1 is the clock signal, and the signal ɸ2 is an inverted clock signal.

The amplifier circuit 60 has the amplifier 62, a feedback capacitor 64, and a switch 66. The capacitor 75 and the switch 74 are connected to a negative side input terminal of the amplifier 62, via the switch 73. Further, each of the first feedback unit 10 and the second feedback unit 20 is connected to the negative side input terminal of the amplifier 62, in parallel with the switch 73.

The feedback capacitor 64 and the switch 66 are connected in parallel between an output terminal and the negative side input terminal of the amplifier 62. The feedback capacitor 64 accumulates the signal that is input to the negative side input terminal of the amplifier 62. The input signal $A_{IN}$, the first feedback signal $FB_1$, and the second feedback signal $FB_2$ are input to the feedback capacitor 64. The feedback capacitor 64 functions as an addition and subtraction unit which adds and subtracts the first feedback signal $FB_1$ and the second feedback signal $FB_2$, respectively, to and from the input signal $A_{IN}$.

The voltage of the feedback capacitor 64 is the voltage of the output signal $A_{OUT}$. The switch 66 performs switching whether to connecting the two electrodes of the feedback capacitor 64. By connecting the two electrodes of the feedback capacitor 64, the electric charge accumulated in the feedback capacitor 64 is discharged, and the voltage of the output signal $A_{OUT}$ is reset to the reference potential (for example, 0 V). The switch 66 may be controlled by the reset circuit 116 shown in FIG. 1. The reset circuit 116 may set the switch 66 to be in the on state and reset the voltage of the output signal $A_{OUT}$, for each time when one AD conversion is completed (that is, for each time when each of the first period and the second period elapses once).

The first feedback unit 10 of the present example has a third capacitor 15, a switch 11, a switch 12, a switch 13, and a switch 14. The third capacitor 15 accumulates the electric charge in accordance with the output signal $A_{OUT}$.

The switch 11 and the switch 12 are connected to one electrode of the third capacitor 15. The switch 11 performs switching regarding whether to connect the electrode of the third capacitor 15 to the feedback capacitor 64. The switch 12 performs switching regarding whether to connect the electrode of the third capacitor 15 to the reference potential.

The switch 13 and the switch 14 are connected to the other electrode of the third capacitor 15. The switch 13 performs switching regarding whether to connect the other electrode of the third capacitor 15 to the output terminal of the amplifier 62. The switch 14 performs switching regarding whether to connect the other electrode of the third capacitor 15 to the reference potential.

The switch 11 and the switch 14 are controlled by the signal 2. The switch 12 and the switch 13 are controlled by the signal φ1. When the signal φ1 indicates the on state and the signal φ2 indicates the off state, the third capacitor 15 is charged by the output signal $A_{OUT}$. When the signal φ1 indicates the off state and the signal φ2 indicates the on state, the electric charge of the third capacitor 15 is transferred to the feedback capacitor 64. In this manner, the first feedback signal $FB_1$ is added to the input signal $A_{IN}$.

The second feedback unit 20 has a switched capacitor 30, a switched capacitor 40, and the selection unit 50. The switched capacitor 30 and the switched capacitor 40 cooperate to function as the delay circuit 22, and also function as the gain circuit 24. That is, the second feedback unit 20 of the present example has a circuit in common which functions as the delay circuit 22 and the gain circuit 24.

For example, in both of a case of functioning as the delay circuit 22 and a case of functioning as the gain circuit 24, the second feedback unit 20 uses a capacitor in common (for example, a first capacitor 35) to generate the second feedback signal $FB_2$. In this way, by causing the circuits of the delay circuit 22 and the gain circuit 24 to be common, an overall size of the circuit can be small. The selection unit 50 performs switching regarding whether to cause the switched capacitor 30 and the switched capacitor 40 to function as the delay circuit 22, or to function as the gain circuit 24.

The switched capacitor 30 has the first capacitor 35, a switch 31, a switch 32, a switch 33, and a switch 34. The first capacitor 35 accumulates the electric charge in accordance with the output signal $A_{OUT}$. The switch 31, the switch 32, the switch 33, and the switch 34 function as a first charging and discharging switching unit which performs switching regarding whether to charge the first capacitor 35 according to the output signal $A_{OUT}$, or to connect the first capacitor to the feedback capacitor 64, during each period of the first period and the second period.

The switch 31 and the switch 32 are connected to one electrode of the first capacitor 35. The switch 31 performs switching regarding whether to connect the electrode of the first capacitor 35 to the feedback capacitor 64. The switch 32 performs switching regarding whether to connect the electrode of the first capacitor 35 to the selection unit 50. The switch 33 and the switch 34 are connected to the other electrode of the first capacitor 35. The switch 33 performs switching regarding whether to connect the other electrode of the first capacitor 35 to the selection unit 50. The switch 34 performs switching regarding whether to connect the other electrode of the first capacitor 35 to the reference potential.

The switch 31 and the switch 34 are controlled by a signal φ2_1. The switch 32 and the switch 33 are controlled by a signal φ1_1. When the signal φ1_1 indicates the on state and the signal φ2_1 indicates the off state, the first capacitor 35 is charged according to the output signal $A_{OUT}$ via the selection unit 50. The selection unit 50 performs switching, between the two electrodes of the first capacitor 35, regarding which is to be connected to the reference potential and which is connected to the output terminal of the amplifier 62. In this manner, the switching is performed regarding which electrode of the first capacitor 35 the reference potential is to be applied to, and which electrode the output signal $A_{OUT}$ is to be applied to.

In the present specification, which electrode of the capacitor is connected to the reference potential may be referred to as a polarity of the capacitor. That is, the polarity of the capacitor is different between a state in which the reference potential is applied to one electrode of the capacitor, and a state in which the reference potential is applied to the other electrode of the capacitor.

When the signal φ1_1 indicates the off state and the signal φ2_1 indicates the on state, the electric charge of the first capacitor 35 is transferred to the feedback capacitor 64. According to the polarity of the first capacitor 35, the voltage of the first capacitor 35 is added to or subtracted from the input signal $A_{IN}$.

The switched capacitor 40 has a second capacitor 45, a switch 41, a switch 42, a switch 43, and a switch 44. The second capacitor 45 is provided in parallel with the first capacitor 35, and accumulates the electric charge in accordance with the output signal $A_{OUT}$. The switch 41, the switch 42, the switch 43, and the switch 44 function as a second charging and discharging switching unit which performs switching regarding whether to charge the second capacitor 45 according to the output signal $A_{OUT}$, or to connect the second capacitor to the feedback capacitor 64, during each period of the first period and the second period.

The switch 41 and the switch 42 are connected to one electrode of the second capacitor 45. The switch 41 performs switching regarding whether to connect the electrode of the second capacitor 45 to the feedback capacitor 64. The switch 42 performs switching regarding whether to connect the electrode of the second capacitor 45 to the selection unit 50. The switch 43 and the switch 44 are connected to the other electrode of the second capacitor 45. The switch 43 performs switching regarding whether to connect the other electrode of the second capacitor 45 to the selection unit 50. The switch 44 performs switching regarding whether to connect the other electrode of the second capacitor 45 to the reference potential.

The switch 41 and the switch 44 are controlled by a signal φ2_2. The switch 42 and the switch 43 are controlled by a signal φ1_2. When the signal φ1_2 indicates the on state and the signal φ2_2 indicates the off state, the second capacitor 45 is charged according to the output signal $A_{OUT}$ via the selection unit 50.

The selection unit 50 performs switching, between the two electrodes of the second capacitor 45, regarding which is to be connected to the reference potential and which is to be connected to the output terminal of the amplifier 62. In this manner, the polarity of the second capacitor 45 is switched.

When the signal φ1_2 indicates the off state and the signal φ2_2 indicates the on state, the electric charge of the second capacitor 45 is transferred to the feedback capacitor 64. According to the polarity of the second capacitor 45, the voltage of the second capacitor 45 is added to or subtracted from the input signal $A_{IN}$.

The selection unit 50 has a first polarity switching unit 51 and a second polarity switching unit 52. The first polarity switching unit 51 causes the polarity of the first capacitor 35 to be different between the first period and the second period. The second polarity switching unit 52 causes the polarity of the second capacitor 45 to be different between the first period and the second period.

The first polarity switching unit 51 of the present example has a switch 53, a switch 54, a switch 55, and a switch 56.

The switch 53 performs switching regarding whether to connect the other electrode of the first capacitor 35 to the ground potential via the switch 33. The switch 54 performs switching regarding whether to connect the other electrode of the first capacitor 35 to the output terminal of the amplifier 62 via the switch 33. The switch 55 performs switching regarding whether to connect the one electrode of the first capacitor 35 to the ground potential via the switch 32. The switch 56 performs switching regarding whether to connect the one electrode of the first capacitor 35 to the output terminal of the amplifier 62 via the switch 32.

The on and off states of the switch 53 and the switch 56 are the same as each other, and the on and off states of the switch 54 and the switch 55 are the same as each other. In this manner, the first polarity switching unit 51 performs switching regarding which electrode of the first capacitor 35 the ground potential is to be applied to, and which electrode the output terminal of the amplifier 62 is to be connected to.

The second polarity switching unit 52 of the present example has the same configuration as that of the first polarity switching unit 51. The second polarity switching unit 52 may set the polarity of the second capacitor 45 to be the same as the polarity of the first capacitor 35. Each of the first capacitor 35 and the second capacitor 45 has a first electrode connected to the input terminal of the amplifier 62, and a second electrode on an opposite side of the first electrode.

Setting the polarities to be the same between the capacitors means applying the reference potential to the same electrode of each capacitor. For example, a state in which the reference potential is applied to the first electrode of each of two capacitors, or a state in which the reference potential is applied to the second electrode of each of two capacitors, is the state in which the polarities of the two capacitors are the same as each other.

In the second polarity switching unit 52, the switch 53 performs switching regarding whether to connect the second electrode of the second capacitor 45 to the ground potential via the switch 43. The switch 54 performs switching regarding whether to connect the second electrode of the second capacitor 45 to the output terminal of the amplifier 62 via the switch 43. The switch 55 performs switching regarding whether to connect the first electrode of the second capacitor 45 to the ground potential via the switch 42. The switch 56 performs switching regarding whether to connect the first electrode of the second capacitor 45 to the output terminal of the amplifier 62 via the switch 42. Each switch of the first polarity switching unit 51 and the second polarity switching unit 52 may be controlled by the control unit 114.

Figure 4:
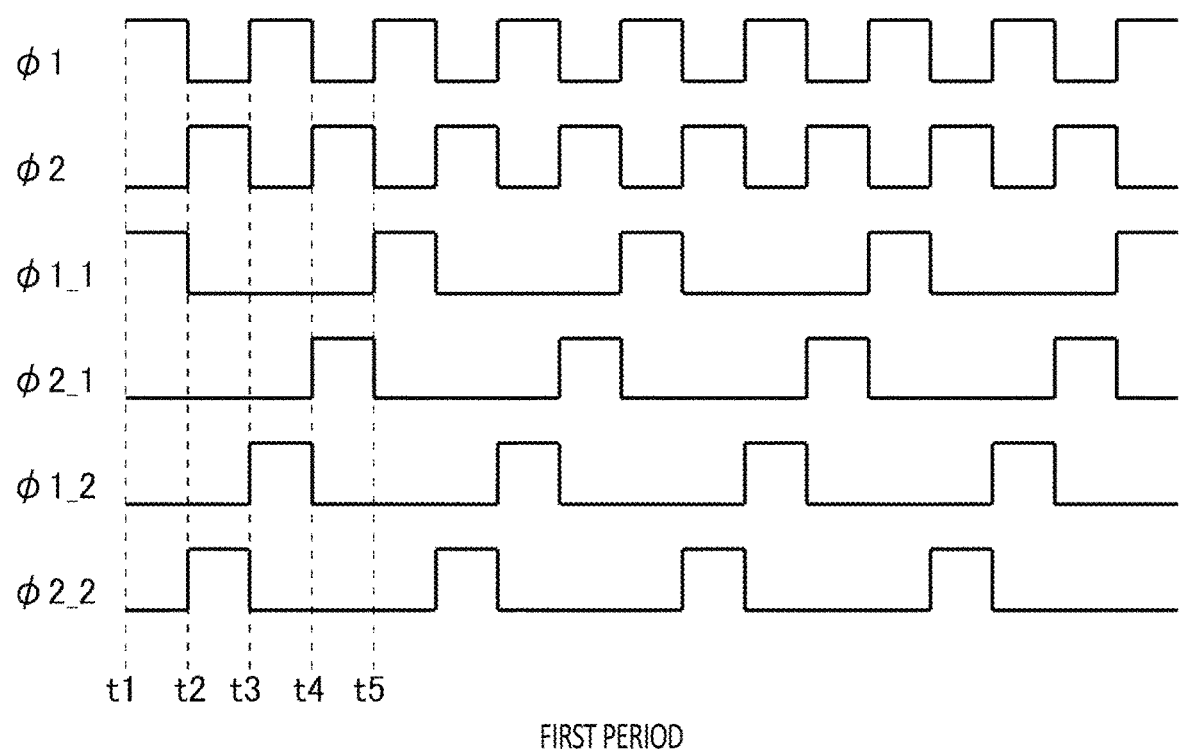
FIG. 4 is a timing chart showing an example of each signal ok during a first period.

FIG. 4 is a timing chart showing an example of each signal ok during a first period. As described above, the second feedback unit 20 functions as the delay circuit 22 during the first period. The first polarity switching unit 51 and the second polarity switching unit 52 control the polarity of each capacitor such that during the first period, the second feedback signal $FB_2$ in accordance with the electric charges with which the first capacitor 35 and the second capacitor 45 are charged, is subtracted from the input signal $A_{IN}$.

During the first period, the switch 53 and the switch 56 of the first polarity switching unit 51 and the second polarity switching unit 52 are in the on state, and the switch 54 and the switch 55 are in the off state. In this manner, the voltages of the first capacitor 35 and the second capacitor 45 are subtracted from the feedback capacitor 64.

Each switch of the switched capacitor 30 charges the first capacitor 35 according to the signal $\phi 1\_1$. Each switch of the switched capacitor 30 connects the first capacitor 35 to the feedback capacitor 64 according to the signal $\phi 2\_1$. In this manner, the feedback capacitor 64 is discharged according to the electric charge of the first capacitor 35. Whether the feedback capacitor 64 is charged or discharged according to an electric field of the first capacitor 35, is changed by the polarity of the first capacitor 35.

Each switch of the switched capacitor 40 charges the second capacitor 45 according to the signal $\phi 1\_2$. Each switch of the switched capacitor 40 connects the second capacitor 45 to the feedback capacitor 64 according to the signal $\phi 2\_2$. In this manner, the feedback capacitor 64 is discharged according to the electric charge of the second capacitor 45. Whether the feedback capacitor 64 is charged or discharged according to an electric field of the second capacitor 45, is changed by the polarity of the second capacitor 45. As shown in FIG. 4, during the first period, the second capacitor 45 is charged at a timing different from that of the first capacitor 35, and the second capacitor 45 is connected to the feedback capacitor 64 at a timing different from that of the first capacitor 35.

In the example of FIG. 4, at a time t1, the signal $\phi 1$ and the signal $\phi 1\_1$ indicate the on state, and the other signals indicate the off state. In this manner, the capacitor 75 is charged according to the input signal $A_{IN}$, and the first capacitor 35 and the third capacitor 15 are charged according to the output signal $A_{OUT}$.

At a time t2, the signal $\phi 2$ and the signal $\phi 2\_2$ indicate the on state, and the other signals indicate the off state. In this manner, the electric charge of the capacitor 75 is transferred to the feedback capacitor 64, the feedback capacitor 64 is discharged according to the electric charge of the second capacitor 45, and the feedback capacitor 64 is charged according to the electric charge of the third capacitor 15.

At a time t3, the signal $\phi 1$ and the signal $\phi 1\_2$ indicate the on state, and the other signals indicate the off state. In this manner, the capacitor 75 is charged according to the input signal $A_{IN}$, and the second capacitor 45 and the third capacitor 15 are charged according to the output signal $A_{OUT}$.

At a time t4, the signal $\phi 2$ and the signal $\phi 2\_1$ indicate the on state, and the other signals indicate the off state. In this manner, the capacitor 75 is charged according to the input signal $A_{IN}$, the feedback capacitor 64 is discharged according to the electric charge of the first capacitor 35, and the feedback capacitor 64 is charged according to the electric charge of the third capacitor 15. After a time t5, the operations from the time t1 to the time t4 are repeated.

In the present example, the cycles of the signal $\phi 1\_1$, the signal $\phi 1\_2$, the signal $\phi 2\_1$, and the signal $\phi 2\_2$ are twice the cycles of the signal $\phi 1$ and the signal $\phi 2$. That is, the operation cycles of the switched capacitor 30 and the switched capacitor 40 are twice the operation cycles of the switched capacitor 70 and the first feedback unit 10. Therefore, it is possible to cause the second feedback unit 20 to function as the delay circuit 22.

Figure 5:
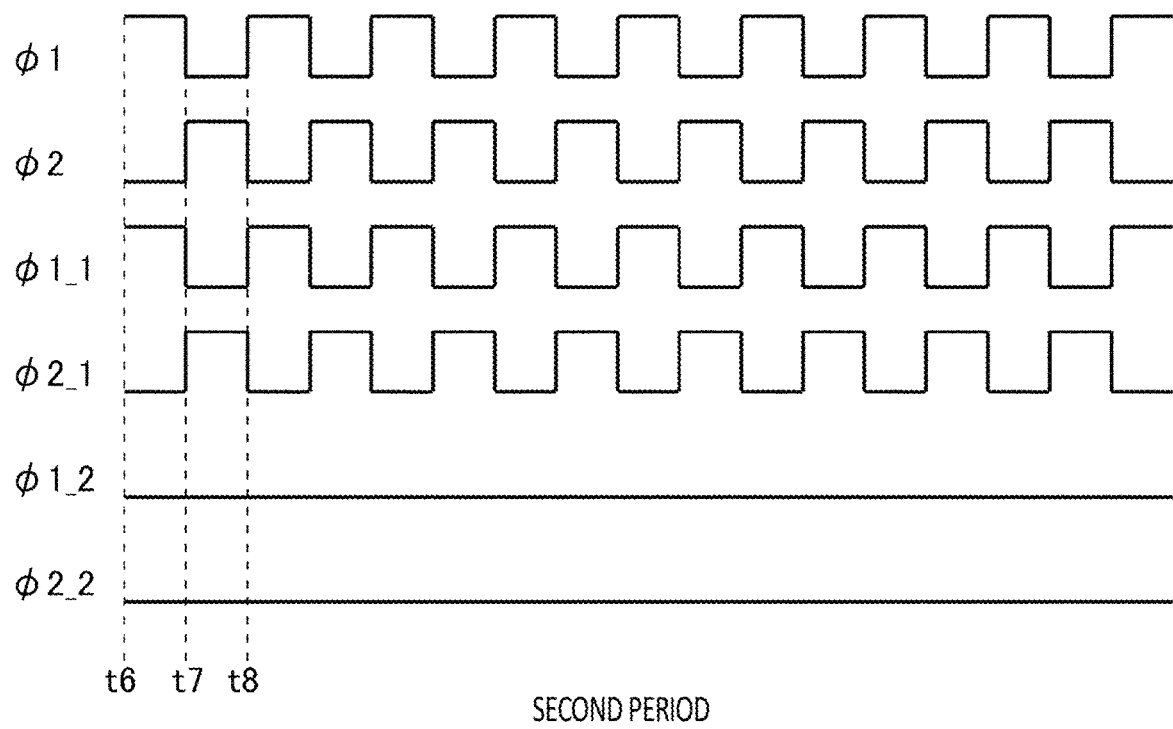
FIG. 5 is a timing chart showing an example of each signal ok during a second period.

FIG. 5 is a timing chart showing an example of each signal ok during a second period. As described above, the second feedback unit 20 functions as the gain circuit 24 during the second period. The first polarity switching unit 51 and the second polarity switching unit 52 switch the polarities of the first capacitor 35 and the second capacitor 45 such that during the second period, the second feedback signal $FB_2$ in accordance with the electric charge with which the first capacitor 35 is charged and the electric charge with which the second capacitor 45 is charged, is added to the input signal $A_{IN}$.

During the second period, the switch 53 and the switch 56 of the selection unit 50 are in the off state, and the switch 54 and the switch 55 are in the on state. In this manner, the voltages of the first capacitor 35 and the second capacitor 45 are added to the feedback capacitor 64.

Each switch of the switched capacitor 30 of the present example causes a switching cycle to be different between the first period and the second period. The switching cycle is a cycle for switching regarding whether to charge the first capacitor 35 according to the output signal $A_{OUT}$, or to connect the first capacitor 35 to the feedback capacitor 64 (functioning as the addition and subtraction unit). Each switch of the switched capacitor 40 of the present example stops charging and discharging the second capacitor 45 during the second period. In this way, by switching the polarity of each capacitor and switching the operation cycle of each switched capacitor, it is possible to perform switching regarding which of the delay circuit 22 and the gain circuit 24, the second feedback unit 20 is caused to function as.

In the examples of FIG. 4 and FIG. 5, cycles in which pulses are generated in the signal ϕ1_1 and the signal ϕ2_1 correspond to the switching cycles. Each switch of the switched capacitor 30 may operate such that the switching cycle during the second period is shorter than the switching cycle during the first period. In the example of FIG. 4, the pulse cycles of the signal ϕ1_1 and the signal ϕ2_1 during the first period are twice the cycles of the signal ϕ1 and the signal ϕ2. In the example of FIG. 5, the pulse cycle of the signal ϕ1_1 and the signal ϕ2_1 during the first period is the same as the cycle of the signal ϕ1 and the signal ϕ2.

In the example of FIG. 5, at a time t6, the signal ϕ1 and the signal ϕ1_1 indicate the on state, and the other signals indicate the off state. In this manner, the capacitor 75 is charged according to the input signal $A_{IN}$, and the first capacitor 35 and the third capacitor 15 are charged according to the output signal $A_{OUT}$.

At a time t7, the signal ϕ2 and the signal ϕ2_1 indicate the on state, and the other signals indicate the off state. In this manner, the electric charge of the capacitor 75 is transferred to the feedback capacitor 64, and the feedback capacitor 64 is charged according to the electric charges of the first capacitor 35 and the third capacitor 15.

After a time t8, the operations at the time t6 and the time t7 are repeated. In this manner, the switched capacitor 30 operates as the gain circuit 24. The switched capacitor 40 is not charged or discharged during the second period. Capacitances of the capacitor 75, the feedback capacitor 64, the first capacitor 35, and the second capacitor 45 may be the same as each other. In this case, the gain -x of the gain circuit 24 is -1, and the integrator 100 exponentially amplifies the input signal $A_{IN}$ by three times (2+x=2+1=3) the gain as shown in Math 4.

Figure 6:
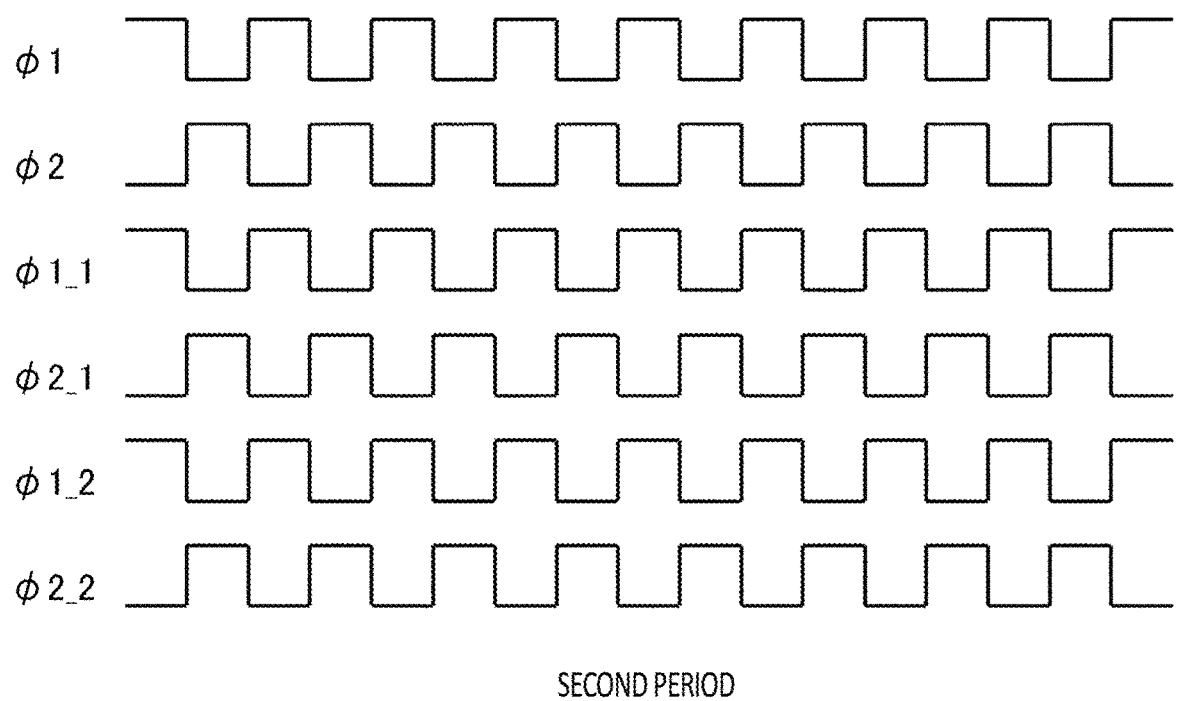
FIG. 6 is a timing chart showing another example of each signal ok during the second period.

FIG. 6 is a timing chart showing another example of each signal ϕk during the second period. In the present example, waveforms of the signal ϕ1_2 and the signal ϕ2_2 are different from those of the example shown in FIG. 5. The waveforms of the other signals are similar to those of the example shown in FIG. 5.

Each switch of the switched capacitor 40 of the present example charges and discharges the second capacitor 45 at the same timing as that of the first capacitor 35, during the second period. As shown in FIG. 6, the waveforms of the signal ϕ1_2 and the signal ϕ2_2 may be the same as the waveforms of the signal ϕ1_1 and the signal ϕ2_1. In the present example, the switched capacitor 40 operates as a circuit in which the gain is 1, the gain -x of the second feedback unit 20 is -2, and the integrator 100 exponentially amplifies the input signal $A_{IN}$ by four times the gain.

In the example of FIG. 6, the waveforms of the signal ϕ1_2 and the signal ϕ2_2 are the same as the waveforms of the signal ϕ1_1 and the signal ϕ2_1. In another example, the waveform of the signal ϕ1_2 may be a waveform obtained by reversing a positive side and a negative side of the waveform of the signal ϕ1_1, and the waveform of the signal ϕ2_2 may be a waveform obtained by reversing a positive side and a negative side of the waveform of the signal ϕ2_1.

Figure 7:
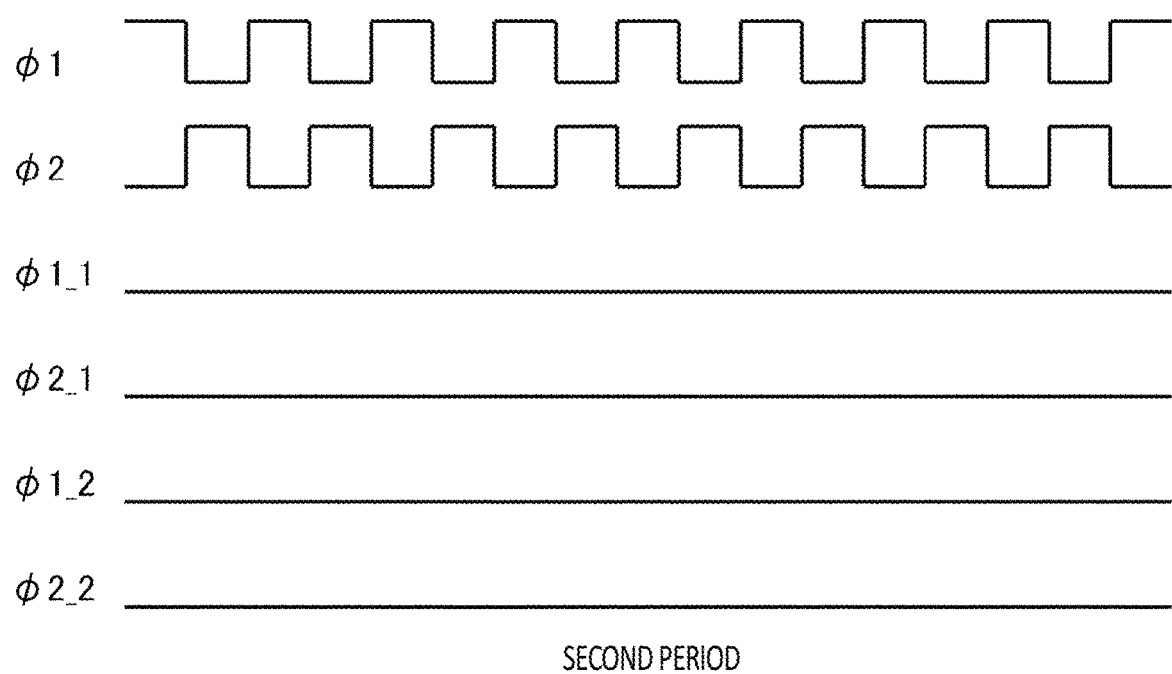
FIG. 7 is a timing chart showing another example of each signal ok during the second period.

FIG. 7 is a timing chart showing another example of each signal ϕk during the second period. In the present example, the waveforms of the signal ϕ1_1, the signal ϕ1_2, the signal ϕ2_1, and the signal ϕ2_2 are different from those of the example of FIG. 5. The waveforms of the other signals are similar to those of the example shown in FIG. 5.

Each switch of the switched capacitor 30 of the present example stops charging and discharging the first capacitor 35, during the second period. Further, each switch of the switched capacitor 40 stops charging and discharging the second capacitor 45, during the second period. In the present example, the gain -x of the second feedback unit 20 is 0, and the integrator 100 operates as the amplifier of two times the gain.

Figure 8:
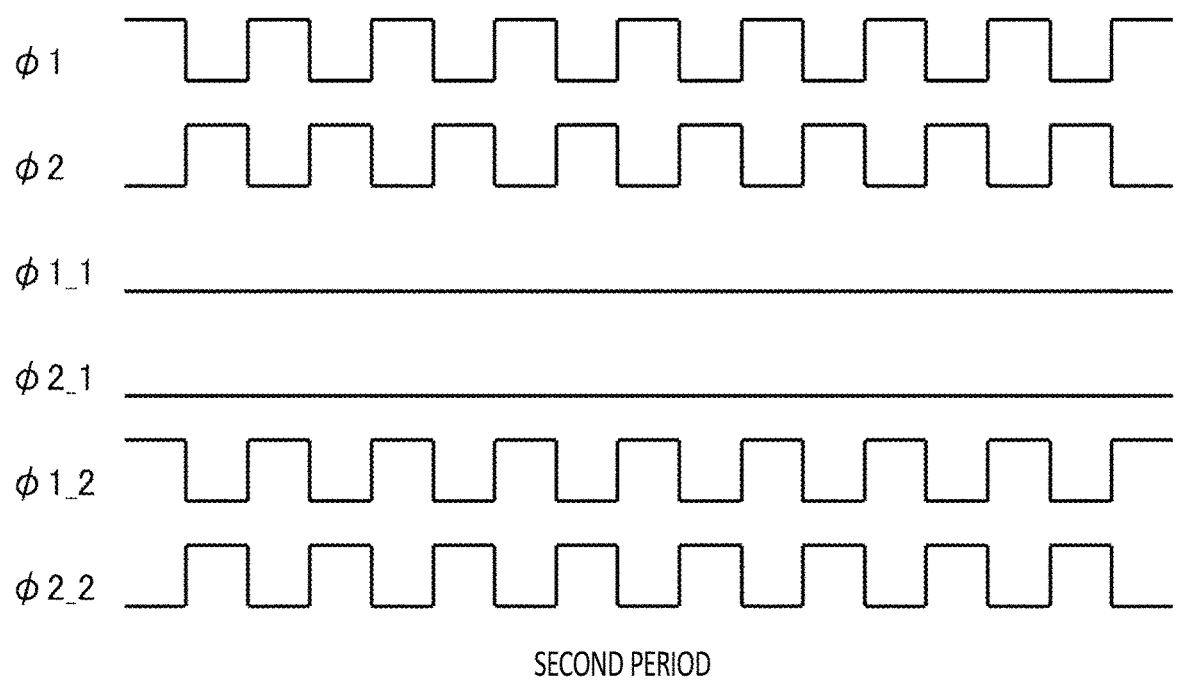
FIG. 8 is a timing chart showing another example of each signal ok during the second period.

FIG. 8 is a timing chart showing another example of each signal ϕk during the second period. In the present example, the waveforms of the signal ϕ1_1 and the signal ϕ2_1 are swapped with the waveforms of the signal ϕ1_2 and the signal ϕ2_2. The waveforms of the other signals are similar to those of the example shown in FIG. 5. That is, the switched capacitor 30 of the present example operates similarly to the switched capacitor 40 of the example of FIG. 5, and the switched capacitor 40 of the present example operates similarly to the switched capacitor 30 of the example of FIG. 5.

Each switch of the switched capacitor 30 of the present example stops charging and discharging the first capacitor 35, during the second period. Each switch of the switched capacitor 40 charges and discharges the second capacitor 45, during the second period. The integrator 100 of the present example exponentially amplifies the input signal $A_{IN}$ by three times the gain, similarly to the example of FIG. 5.

The control unit 114 may combine the controls during the second period shown in FIG. 5, FIG. 6, FIG. 7, and FIG. 8. That is, the control unit 114 may perform any of the controls shown in FIG. 5 to FIG. 8 during the second period in a certain AD conversion period, and perform another control shown in FIG. 5 to FIG. 8 during the second period in another AD conversion period. Such a control makes it possible to cause the integrator 100 to function with various characteristics during the second period. Further, in the examples of FIG. 5 and FIG. 8, the gains of the integrator 100 are the same as each other. Note that between the examples of FIG. 5 and FIG. 8, the capacitors (the first capacitor 35 or the second capacitor 45) which are caused to operate during the second period are different from each other. Therefore, by combining the operations shown in FIG. 5 and FIG. 8, it is possible to reduce an influence of a variation in the characteristic of the capacitor.

Figure 9:
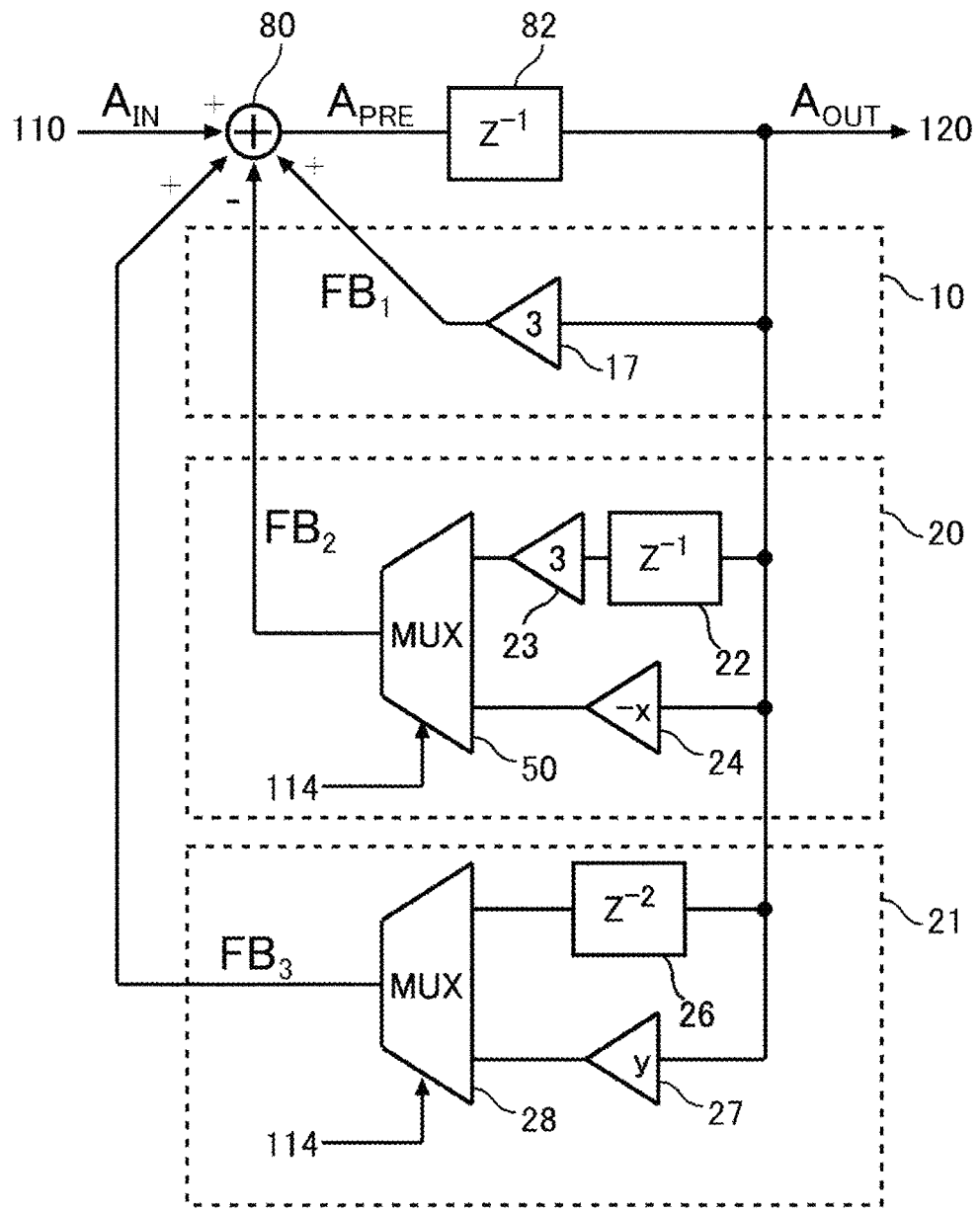
FIG. 9 is a diagram showing another configuration example of the integrator 100.

FIG. 9 is a diagram showing another configuration example of the integrator 100. The integrator 100 in the present example is a third order integrator; however, the integrator 100 may be a higher order integrator. The integrator 100 of the present example has a third feedback unit 21 in addition to the configuration shown in FIG. 2. Further, the gain of the gain circuit 17 of the first feedback unit 10 of the present example is 3.

The second feedback unit 20 of the present example has a gain circuit 23 in addition to the configuration shown in FIG. 2. The gain circuit 23 of the present example amplifies the output of the delay circuit 22 by three times the gain for the input to the selection unit 50.

The third feedback unit 21 has a delay circuit 26, a gain circuit 27, and a selection unit 28. The delay circuit 26 delays the output signal $A_{OUT}$. The delay circuit 26 in the present example may be a second order delay circuit which generates a delay by twice the cycle of the clock signal. The gain circuit 27 amplifies the output signal $A_{OUT}$ by a y times the gain for the output. The y is a value greater than 0, and may be a value greater than or equal to 1, or may be a value greater than or equal to 2.

The selection unit 28 selects the output of the delay circuit 26 during the first period, selects the output of the gain circuit 27 during the second period, for the output to the addition and subtraction unit 80 as a third feedback signal $FB_3$. The addition and subtraction unit 80 adds the first feedback signal $FB_1$ to the input signal $A_{IN}$, and subtracts the second feedback signal $FB_2$ from the input signal $A_{IN}$, and adds the third feedback signal $FB_3$ to the input signal $A_{IN}$.

The output $A_{OUT}$ of the integrator 100 in the present example is expressed by Math 6.

$$A_{OUT} = \frac{m(m-1)(m-2)}{3!} * \frac{(3+x+y)^n - 1}{(3+x+y) - 1} A_{IN} \quad \text{(Math. 6)}$$

As shown in Math 6, it is also possible to improve the amplification factor in the third order integrator 100. The third or higher order integrator 100 is similar.

Figure 10:
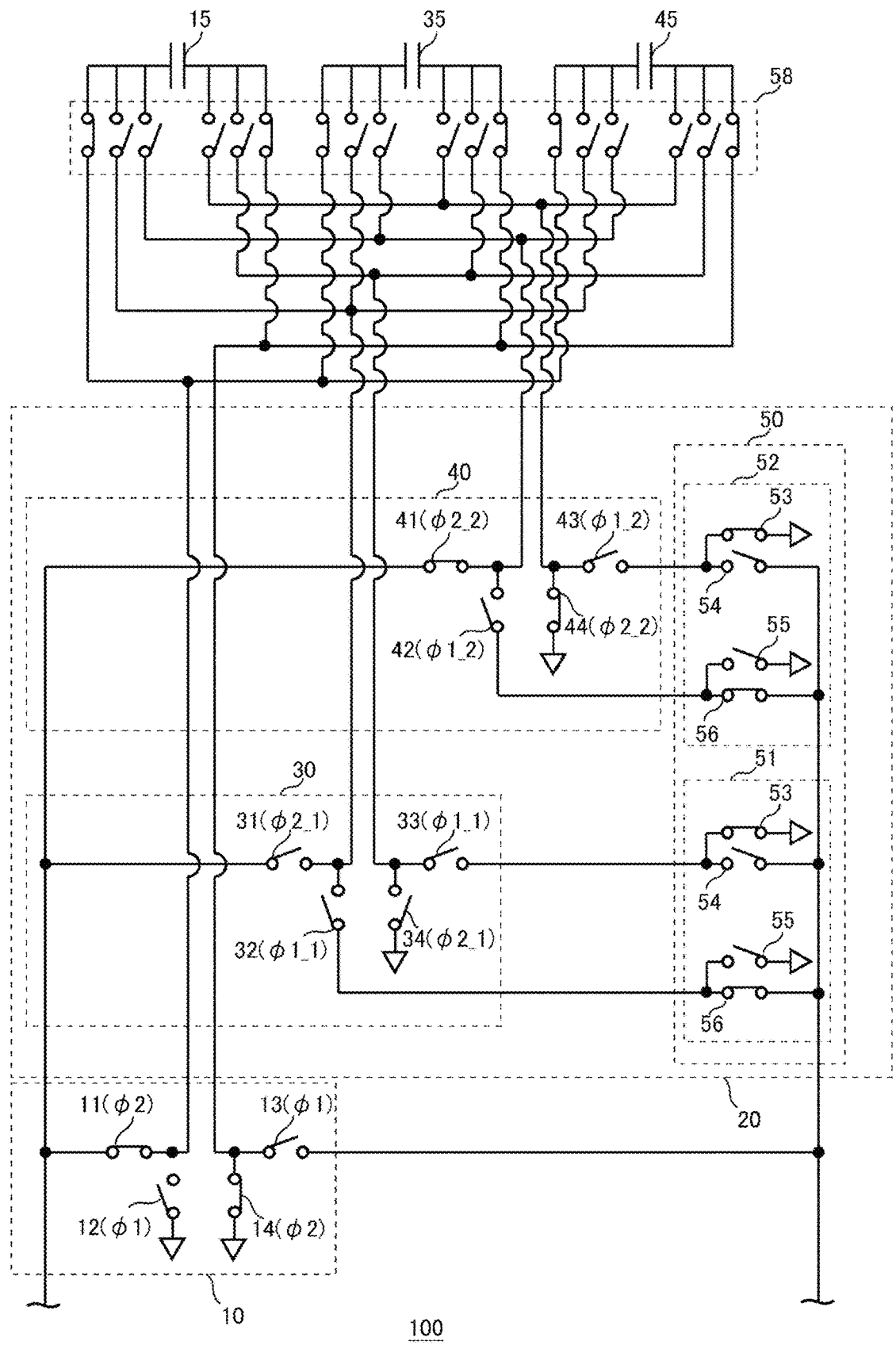
FIG. 10 is a diagram showing another configuration example of the integrator 100.

FIG. 10 is a diagram showing another configuration example of the integrator 100. In FIG. 10, the first feedback unit 10 and the second feedback unit 20 in the integrator 100 are shown, and the other configurations are omitted. The integrator 100 of the present example further includes a capacitance switching unit 58, in addition to the configuration of the second feedback unit 20 shown in FIG. 3. Further, in FIG. 10, the first capacitor 35, the second capacitor 45, and the third capacitor 15 are arranged outside a frame of the switched capacitor 30, the switched capacitor 40, and the first feedback unit 10.

The capacitance switching unit 58 performs switching regarding which of the first capacitor 35, the second capacitor 45, and the third capacitor 15 is caused to function as a capacitor for any of the first feedback unit 10, the switched capacitor 30, and the switched capacitor 40. The capacitance switching unit 58 allocates one capacitor to each of the first feedback unit 10, the switched capacitor 30, and the switched capacitor 40, at each timing. The capacitance switching unit 58 has a switch group which is able to perform switching regarding which of the first feedback unit 10, the switched capacitor 30, and the switched capacitor 40 is to be connected to each capacitor. Each switch of the capacitance switching unit 58 is controlled by the control unit 114.

The capacitance switching unit 58 may perform changing regarding which capacitor of the first feedback unit 10, the switched capacitor 30, and the switched capacitor 40, each capacitor is caused to function as, during at least one period of the first period or the second period. Design values of the capacitances of the respective capacitors in the present example are the same as each other. Note that the capacitance of each capacitor varies by a manufacturing variation, a deterioration over time, or the like. In a case where the capacitance of each capacitor varies, when a role of each capacitor is fixed and the capacitor is caused to operate, the influence of the variation may become great. In the present example, by sequentially switching the role of each capacitor, it is possible to suppress the influence of the variation.

Figure 11:
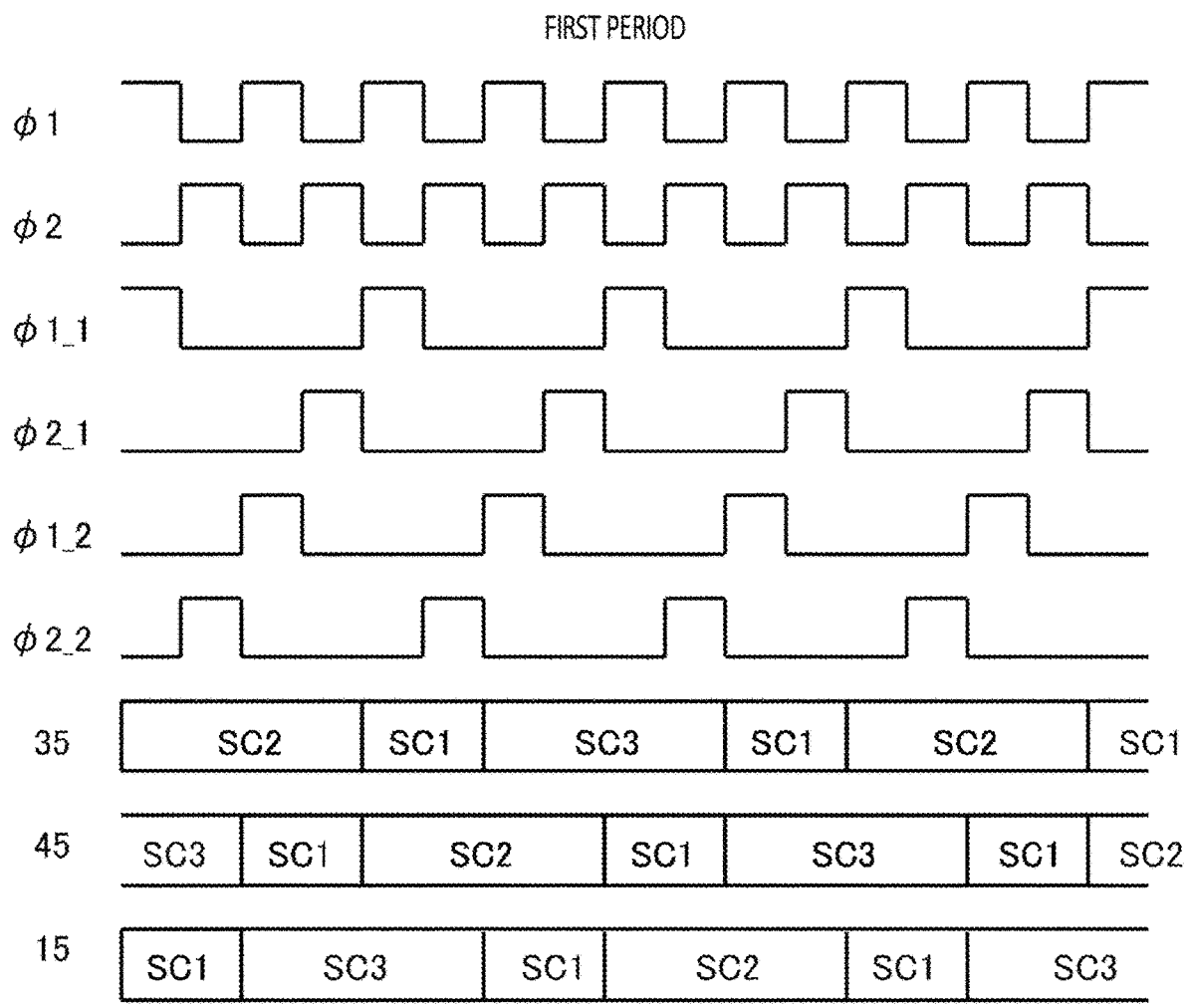
FIG. 11 is a diagram showing an example of switching a role of each capacitor during the first period.

FIG. 11 is a diagram showing an example of switching a role of each capacitor during the first period. Each signal ok in FIG. 11 is similar to that of the example in FIG. 4. In FIG. 11, the role of the first feedback unit 10 as the capacitor is set as SC1, the role of the switched capacitor 30 as the capacitor is set as SC2, and the role of the switched capacitor 40 as a capacitor is set as SC3. Each of the first capacitor 35, the second capacitor 45, and the third capacitor 15 sequentially fulfills the role of each of SC1, SC2, and SC3 within the first period.

The role of each capacitor may transition in a predetermined order. In the example of FIG. 11, the role of each capacitor transitions in order of SC1, SC3, SC1, SC2, SC1, SC3, . . . . In another example, the role of each capacitor may transition in random order. The period during which each capacitor functions as SC1 may be for one cycle of the clock signal. The period during which each capacitor functions as SC2 or SC3 may be for two cycles of the clock signal. In this way, by sequentially switching the role of each capacitor, it is possible to suppress the influence of the variation in the capacitance of each capacitor.

Figure 12:
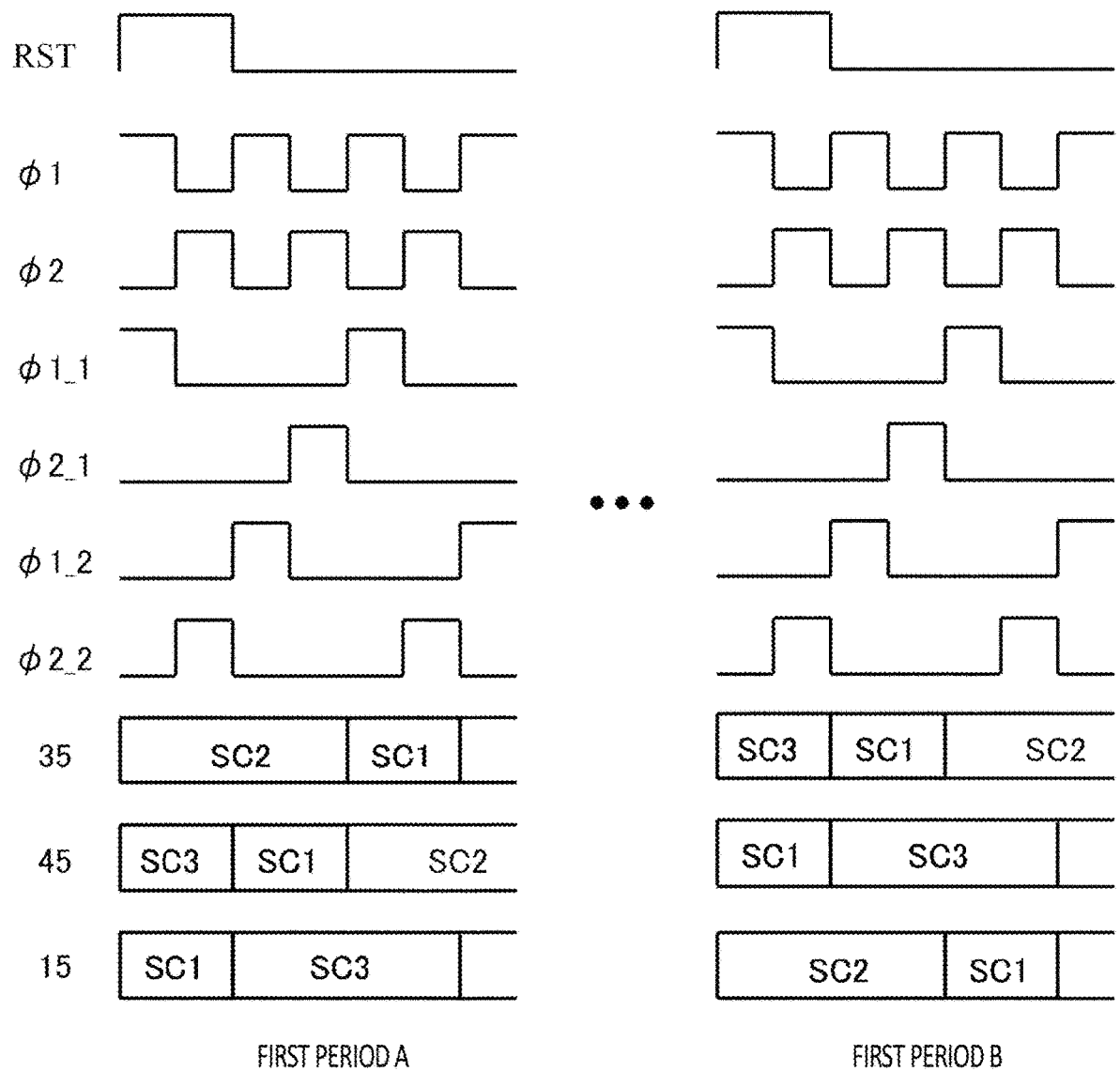
FIG. 12 is a diagram showing an example of switching the role of each capacitor in a plurality of first periods.

FIG. 12 is a diagram showing an example of switching the role of each capacitor in a plurality of first periods. A first period A is the first period in a certain AD conversion period, and a first period B is the first period in a next AD conversion period. The second period and the reset period are provided between the first period A and the first period B.

Each signal ok during the first period is similar to that of the example of FIG. 4. In FIG. 12, a reset signal RST is shown. According to a rising edge of the reset signal, the output signal $A_{OUT}$ of the integrator 100 is reset to the initial value. The reset signal may be generated by the reset circuit 116 at a start time of each AD conversion (that is, at a start time of the first period).

During each first period, the role of each capacitor transitions in a predetermined order, similarly to the example of FIG. 11. The roles of the respective capacitors at the start time of each first period may be the same as or different from each other. In the example of FIG. 12, the roles of the respective capacitors at the start time of each first period are different from each other. A setting of the role of each capacitor at the start time of each first period may be a setting in a preset order, or may be a random setting. With the present example, it is possible to further suppress the influence of the variation in the capacitance of each capacitor.

Figure 13:
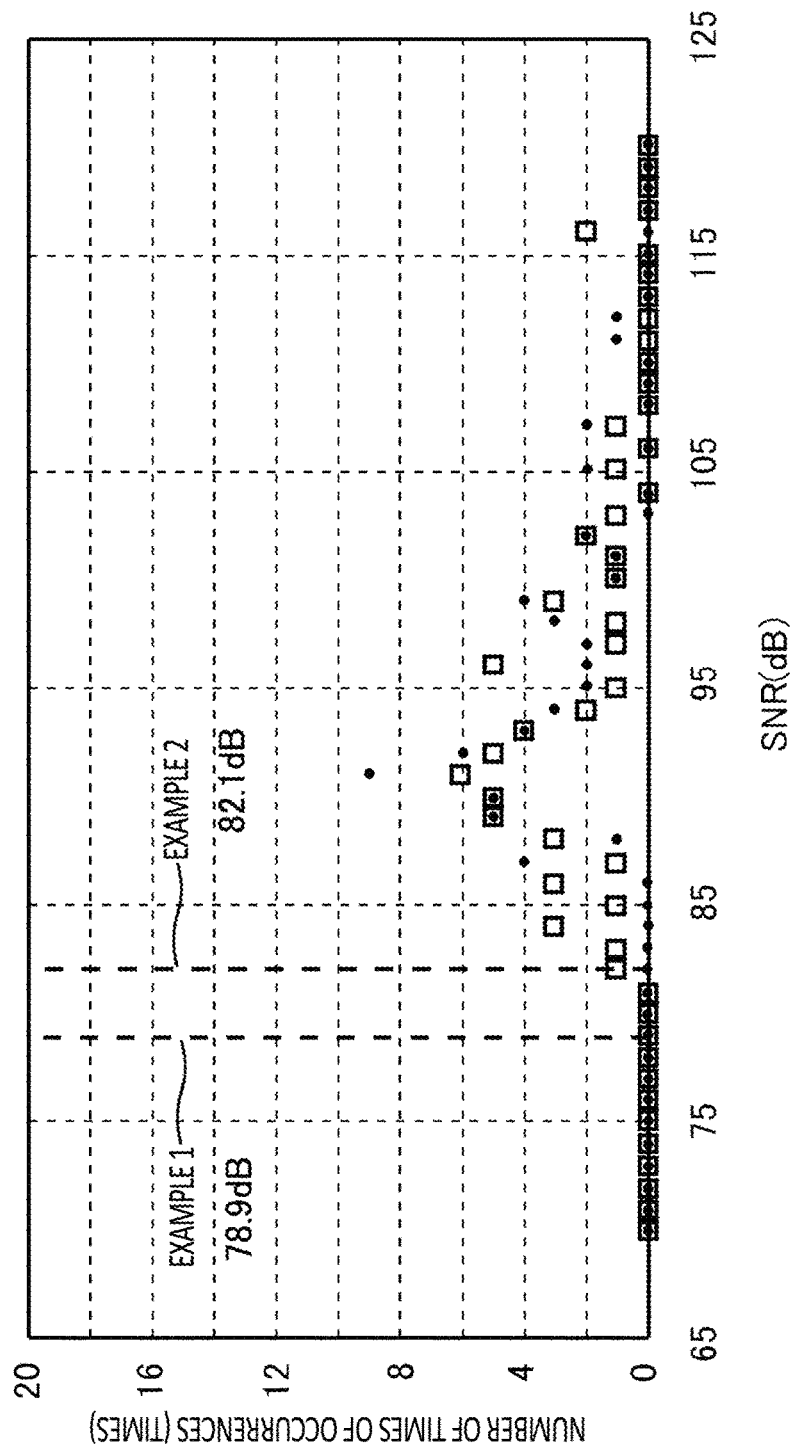
FIG. 13 is a diagram showing an example of a signal-to-noise ratio SNR of an output signal $A_{OUT}$ of the integrator 100.

FIG. 13 is a diagram showing an example of a signal-to-noise ratio SNR of an output signal $A_{OUT}$ of the integrator 100. Example 1 is an example in which the operation is performed without changing the role of each capacitor, and Example 2 is an example in which the role of each capacitor is sequentially changed and the operation is performed as shown in FIG. 11. A square plot of FIG. 13 corresponds to Example 1, and a black circle plot corresponds to Example 2. A broken line shown in FIG. 13 indicates a position of 4.50 in a distribution of each plot. In Example 1, the SNR at 4.5 g was 78.9 dB, whereas in Example 2, the SNR at 4.50 was 82.1 dB. That is, the SNR is improved by 3.2 dB by performing the control as shown in FIG. 11.

Figure 14:
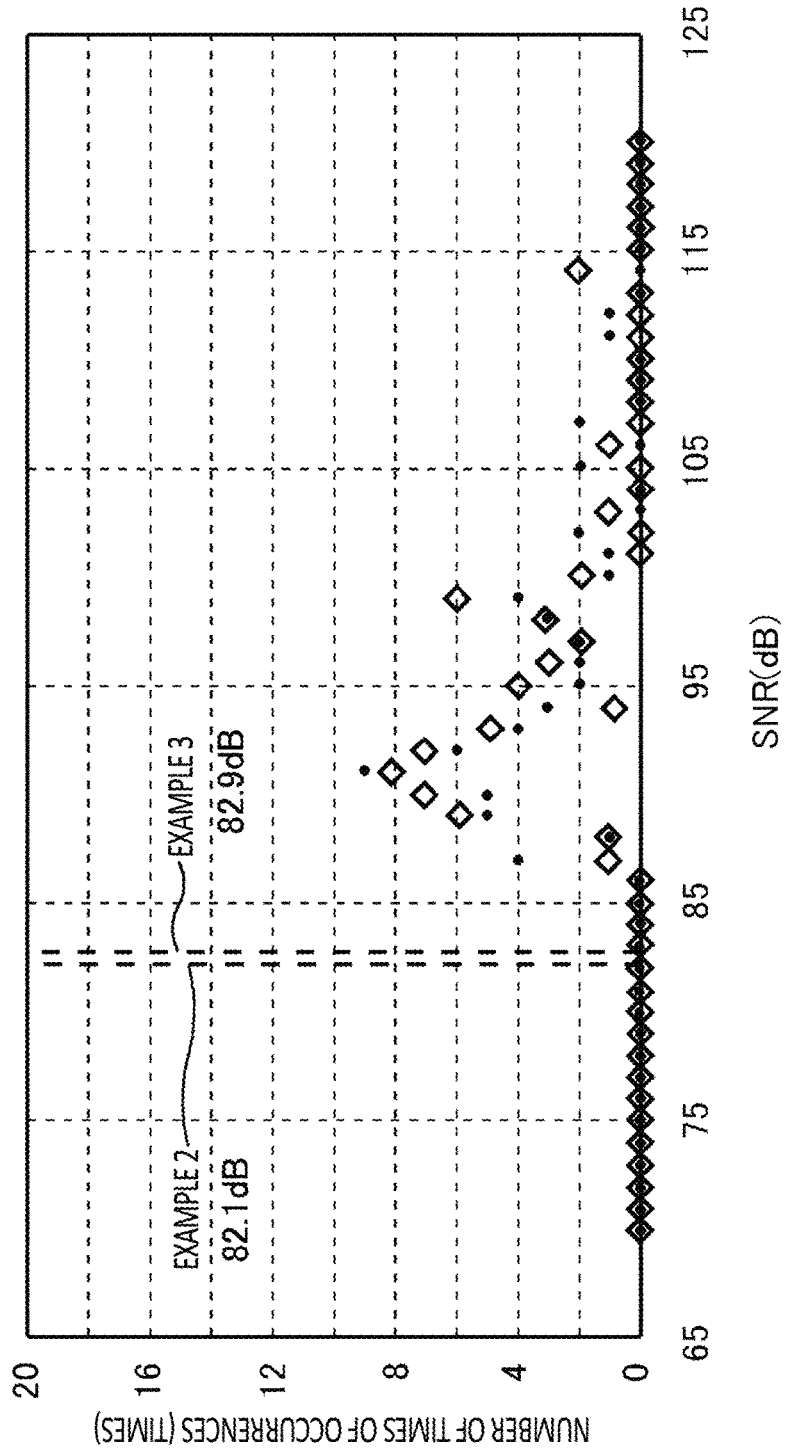
FIG. 14 is a diagram showing an example of the signal-to-noise ratio SNR of the output signal $A_{OUT}$ of the integrator 100.

FIG. 14 is a diagram showing an example of the signal-to-noise ratio SNR of the output signal $A_{OUT}$ of the integrator 100. Example 2 is similar to that of FIG. 13. As shown in FIG. 12, Example 3 is an example in which the roles of the respective capacitors are caused to be different from each other at the start time of each first period, and the roles of the respective capacitors are sequentially changed and the operations are performed within the first period. A diamond type plot of FIG. 14 corresponds to Example 3. In Example 3, the SNR at 4.5 g was 82.9 dB. In Example 3, the SNR is improved by 0.8 dB in comparison with Example 2.

Figure 15:
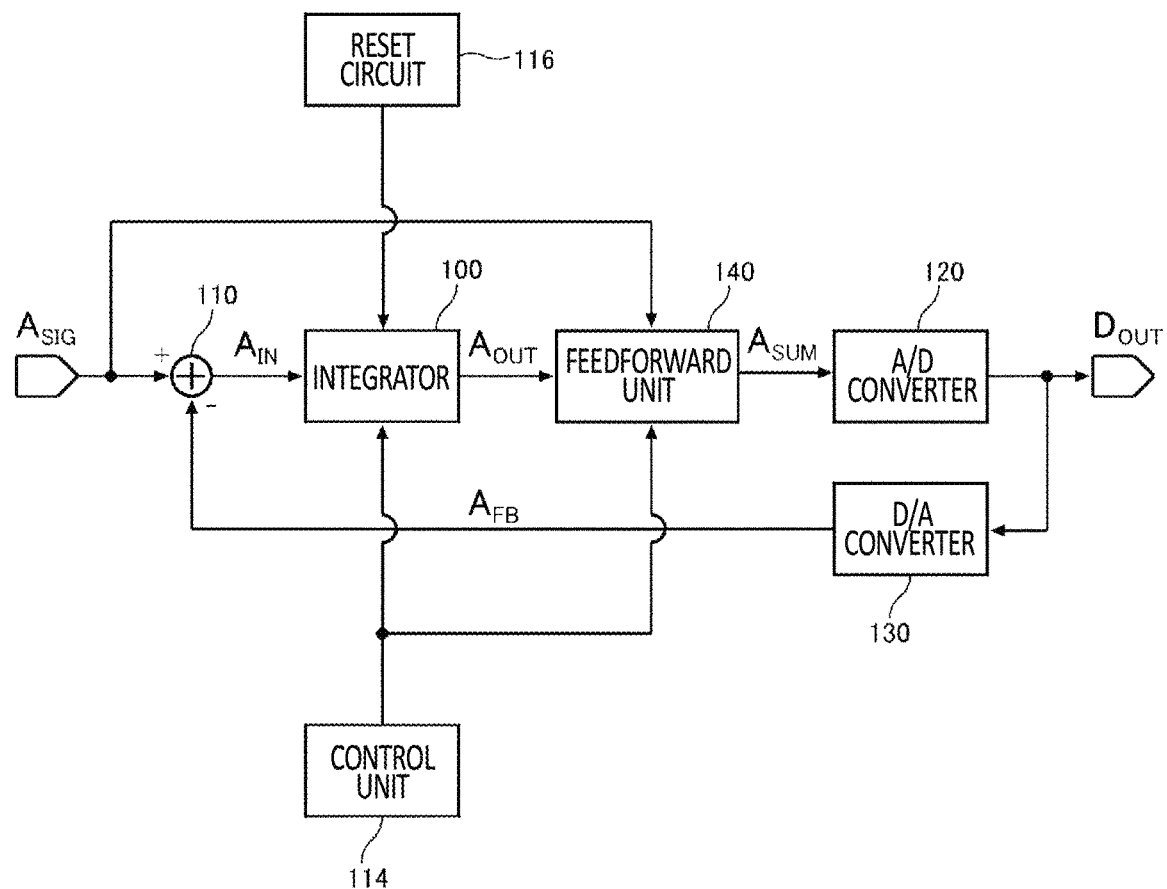
FIG. 15 is a diagram showing another configuration example of the delta-sigma modulator 200.

FIG. 15 is a diagram showing another configuration example of the delta-sigma modulator 200. The delta-sigma modulator 200 of the present example further has a feedforward unit 140 in addition to the configuration shown in FIG. 1. The feedforward unit 140 generates a second output signal $A_{SUM}$ based on the output signal $A_{OUT}$ of the integrator 100 and the analog signal $A_{SIG}$, for the input to the AD conversion unit 120.

Figure 16:
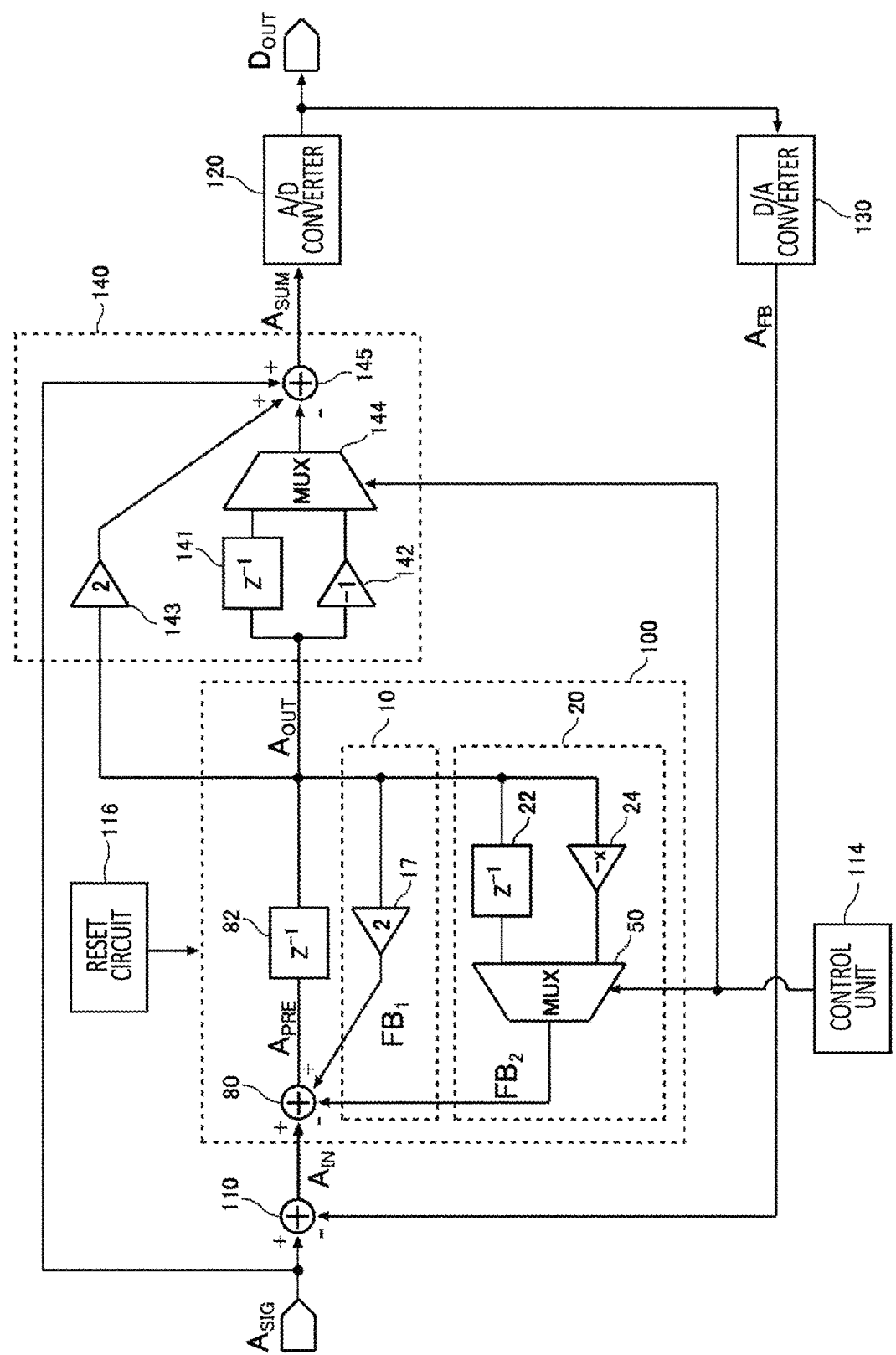
FIG. 16 is a diagram showing a specific configuration example of the delta-sigma modulator 200 shown in FIG. 15.

FIG. 16 is a diagram showing a specific configuration example of the delta-sigma modulator 200 shown in FIG. 15. The configuration other than the feedforward unit 140 is similar to the delta-sigma modulator 200 of any of the aspects described in FIG. 1 to FIG. 15. In FIG. 16, the configuration of FIG. 2 is shown as the integrator 100; however, the integrator 100 may be a high order integrator as shown in FIG. 9. The output signal $A_{OUT}$ during the first period of the integrator 100 of the present example is expressed by Math 7.

$$A_{OUT} = \frac{z^{-1}}{1 - 2z^{-1} + z^{-2}} A_{IN} = \frac{z^{-1}}{(1 - z^{-1})^2} A_{IN} \quad \text{(Math. 7)}$$

The integrator 100 of the present example operates as a first order integrator with a triple feedback coefficient, during the second period. The output signal $A_{OUT}$ of the integrator 100 during the second period is expressed by Math 8.

$$A_{OUT} = \frac{z^{-1}}{1 - 3z^{-1}} A_{IN} \quad \text{(Math. 8)}$$

The feedforward unit 140 of the present example has a delay circuit 141, a gain circuit 142, a gain circuit 143, a selection unit 144, and an addition and subtraction unit 145. The delay circuit 141 delays the output signal $A_{OUT}$ of the integrator 100 by one cycle of the clock signal for the output. The gain circuit 142 amplifies the output signal $A_{OUT}$ by negative one times the gain for the output. The gain circuit 143 amplifies the output signal $A_{OUT}$ by two times the gain for the output.

The selection unit 144 selects the output of the delay circuit 141 during the first period, and selects the output of the gain circuit 142 during the second period, for the output. The addition and subtraction unit 145 adds the output of the gain circuit 143 to the analog signal $A_{SIG}$, and subtracts the output of the selection unit 144 from the analog signal $A_{SIG}$, to generate the output signal $A_{SUM}$.

The output signal $A_{SUM}$ of the feedforward unit 140 during the first period is expressed by Math 9.

$$A_{SUM} = A_{SIG} + (2 - z^{-1}) A_{OUT} \quad \text{(Math. 9)}$$

The output signal $A_{SUM}$ of the feedforward unit 140 during the second period is expressed by Math 10.

$$A_{SUM} = A_{SIG} + 3 A_{OUT} \quad \text{(Math. 10)}$$

By the control unit 114 and the reset circuit 116 switching the controls between the first period and the second period, two output signals $A_{SUM}$ can be obtained as the output of the delta-sigma modulator 200. On an assumption that quantization noise that is generated in the AD conversion unit 120 is set as $E_1$, the digital signal $D_{OUT}$ that is output by the delta-sigma modulator 200 during the first period is expressed by Math 11.

$$\begin{aligned} D_{OUT} &= A_{SUM} + E_1 = \\ &\left( A_{SIG} + \frac{z^{-1}(2 - z^{-1})}{(1 - z^{-1})^2}(A_{SIG} - D_{OUT}) \right) + E_1 \left( \frac{1}{1 - z^{-1}} \right)^2 D_{OUT} = \\ &\left( \frac{1}{1 - z^{-1}} \right)^2 A_{SIG} + E_1 \end{aligned} \quad \text{(Math. 11)}$$

When the initial value of the output signal $A_{OUT}$ of the integrator 100 is set to 0, the analog signal $A_{SIG}$ is set to a constant value, and the digital signal that is output by the AD conversion unit 120 in an ith AD conversion period is set as $D_{OUT}$ (i), the analog signal $A_{SIG}$ is expressed by Math 12.

$$\sum_{i=0}^{n-1} \sum_{j=0}^{i-1} D_{OUT}(j) = \frac{n(n-1)}{2!} A_{SIG} + E_1(n) \quad \text{(Math. 12)}$$

$$A_{SIG} = \frac{\sum_{i=0}^{n-1} \sum_{j=0}^{i-1} D_{OUT}(j)}{\frac{n(n-1)}{2!}} - E_1(n)$$

By the above Math, the analog signal $A_{SIG}$ that is input to the delta-sigma modulator 200 can be expressed by using the digital signal $D_{OUT}$ that is output by the AD conversion unit 120, and it is possible to calculate a digital value $D_{SIG}$ obtained by digitally converting the voltage value of the analog signal $A_{SIG}$. Further, the quantization noise $E_1$ of the AD conversion unit 120 is expressed by Math 13.

$$E_1(n-1) = -A_{OUT2}(n) = \sum_{i=0}^{n-1} \sum_{j=0}^{i-1} D_{OUT}(j) - \frac{n(n-1)}{2!} A_{SIG} \quad \text{(Math. 13)}$$

The output signal $A_{OUT}$ of the integrator 100 during the second period is expressed by Math 14.

$$A_{OUT} = \left( 3^m A_{OUT2}(n) + \frac{z^{-1}}{1 - 3z^{-1}} (A_{SIG} - D_{OUT}) \right) \quad \text{(Math. 14)}$$

As described in Patent Document 1 or the like, the transfer function of the integrator in which the feedback coefficient is greater than 1 is expressed by Math 15.

$$\frac{z^{-1}}{1-xz^1} = \frac{x^m - 1}{x - 1} \quad \text{(Math. 15)}$$

As described above, n and m are the numbers of pulses of the clock signals during the first period and the second period.

The initial value of the integrator 100 at a start time of the second period is $A_{OUT}$ (n), and thus the analog signal $A_{SIG}$ is expressed by Math 16.

$$A_{OUT} = \left( 3^m \left( -\sum_{i=0}^{n-1}\sum_{j=0}^{i-1} D_{OUT}(j) + \frac{n(n-1)}{2!} A_{SIG} \right) + \frac{3^m - 1}{3 - 1}(A_{SIG} - D_{OUT}) \right) \quad \text{(Math. 16)}$$

$$A_{SIG} = \frac{3^m \sum_{i=0}^{n-1}\sum_{j=0}^{i-1} D_{OUT}(j) + (3^m - 1)D_{OUT}}{3^m \frac{n(n-1)}{2!} + (3-1)} - \frac{(3-1)A_{OUT}}{3^m \frac{n(n-1)}{2!} + (3-1)}$$

By Math 16, the analog signal $A_{SIG}$ that is input to the delta-sigma modulator 200 can be expressed by using the digital signal $D_{OUT}$ that is output by the AD conversion unit 120, and it is possible to calculate the digital value $D_{SIG}$ obtained by digitally converting the analog signal $A_{SIG}$.

While the present invention has been described by way of the embodiments, the technical scope of the present invention is not limited to the scope described in the above-described embodiments. It is apparent to persons skilled in the art that various alterations or improvements can be made to the above-described embodiments. It is also apparent from description of the claims that the embodiments to which such alterations or improvements are made can be included in the technical scope of the present invention.

It should be noted that the operations, procedures, steps, stages, etc. of each process performed by a device, system, program, and method shown in the claims, specification, or diagrams can be performed in any order as long as the order is not indicated by "prior to," "before," or the like and as long as the output from a previous process is not used in a later process. Even if the operational flow is described by using phrases such as "first" or "next" in the claims, specification, or diagrams, it does not necessarily mean that the process must be performed in this order.

What is claimed is:

1. A delta-sigma modulator which has an AD conversion period and a reset period, and determines an output by a first period and a second period in the AD conversion period, the delta-sigma modulator comprising:
    an integrator which has
        a first order delay unit which outputs an output signal obtained by delaying a signal in accordance with an input signal,
        a first feedback unit which generates a first feedback signal in accordance with the output signal,
        a second feedback unit which generates a second feedback signal in accordance with the output signal, and
        an addition and subtraction unit which adds and subtracts the first feedback signal and the second feedback signal, respectively, to and from the input signal, for an input to the delay unit;
    an analog-to-digital converter which converts the output signal into a digital signal;
    a digital-to-analog converter which generates a feedback signal in accordance with an output of the analog-to-digital converter, for a subtraction from the input signal; and
    a control unit which causes the second feedback unit to operate as a delay circuit during the first period, and causes the second feedback unit to operate as a gain circuit having a gain smaller than 0 during the second period.

2. The delta-sigma modulator according to claim 1, wherein
    in both of a case of functioning as the delay circuit and a case of functioning as the gain circuit, the second feedback unit uses a capacitor in common to generate the second feedback signal.

3. The delta-sigma modulator according to claim 2, wherein
    the second feedback unit has
        a first capacitor which accumulates an electric charge in accordance with the output signal,
        a first polarity switching unit which causes a polarity of the first capacitor to be different between the first period and the second period, and
        a first charging and discharging switching unit which performs switching regarding whether to charge the first capacitor according to the output signal, or to connect the first capacitor to the addition and subtraction unit, during each period of the first period and the second period.

4. The delta-sigma modulator according to claim 3, wherein
    the first polarity switching unit switches the polarity of the first capacitor such that during the first period, the second feedback signal in accordance with an electric charge with which the first capacitor is charged, is subtracted from the input signal, and during the second period, the second feedback signal in accordance with the electric charge with which the first capacitor is charged, is added to the input signal.

5. The delta-sigma modulator according to claim 3, wherein
    the first charging and discharging switching unit causes a switching cycle to be different between the first period and the second period, the switching cycle being a cycle for switching regarding whether to charge the first capacitor according to the output signal, or to connect the first capacitor to the addition and subtraction unit.

6. The delta-sigma modulator according to claim 5, wherein
    the first charging and discharging switching unit sets the switching cycle during the second period to be shorter than the switching cycle during the first period.

7. The delta-sigma modulator according to claim 3, wherein
    the first charging and discharging switching unit stops charging and discharging the first capacitor, during the second period.

8. The delta-sigma modulator according to claim 3, wherein
    the second feedback unit has
        a second capacitor which is provided in parallel with the first capacitor, and accumulates the electric charge in accordance with the output signal,
        a second polarity switching unit which causes a polarity of the second capacitor to be different between the first period and the second period, and a second charging and discharging switching unit which performs switching regarding whether to charge the second capacitor according to the output signal, or to connect the second capacitor to the addition and subtraction unit, during each period of the first period and the second period.

9. The delta-sigma modulator according to claim 8, wherein
the second polarity switching unit sets the polarity of the second capacitor to be a same as the polarity of the first capacitor.

10. The delta-sigma modulator according to claim 8, wherein
during the first period, the second charging and discharging switching unit charges the second capacitor at a timing different from that of the first capacitor, and connects the second capacitor to the addition and subtraction unit at a timing different from that of the first capacitor.

11. The delta-sigma modulator according to claim 10, wherein
the second charging and discharging switching unit stops charging and discharging the second capacitor, during the second period.

12. The delta-sigma modulator according to claim 10, wherein
the second charging and discharging switching unit charges and discharges the second capacitor at a same timing as that of the first capacitor, during the second period.

13. The delta-sigma modulator according to claim 8, wherein
the first feedback unit has a third capacitor which accumulates the electric charge in accordance with the output signal,
the delta-sigma modulator further comprising:
a capacitance switching unit which performs switching regarding which of the first capacitor, the second capacitor, and the third capacitor is caused to function as a capacitor for any of the first feedback unit and the second feedback unit.

14. The delta-sigma modulator according to claim 4, wherein
the second feedback unit has
a second capacitor which is provided in parallel with the first capacitor, and accumulates the electric charge in accordance with the output signal,
a second polarity switching unit which causes a polarity of the second capacitor to be different between the first period and the second period, and
a second charging and discharging switching unit which performs switching regarding whether to charge the second capacitor according to the output signal, or to connect the second capacitor to the addition and subtraction unit, during each period of the first period and the second period.

15. The delta-sigma modulator according to claim 5, wherein
the second feedback unit has
a second capacitor which is provided in parallel with the first capacitor, and accumulates the electric charge in accordance with the output signal,
a second polarity switching unit which causes a polarity of the second capacitor to be different between the first period and the second period, and
a second charging and discharging switching unit which performs switching regarding whether to charge the second capacitor according to the output signal, or to connect the second capacitor to the addition and subtraction unit, during each period of the first period and the second period.

16. The delta-sigma modulator according to claim 6, wherein
the second feedback unit has
a second capacitor which is provided in parallel with the first capacitor, and accumulates the electric charge in accordance with the output signal,
a second polarity switching unit which causes a polarity of the second capacitor to be different between the first period and the second period, and
a second charging and discharging switching unit which performs switching regarding whether to charge the second capacitor according to the output signal, or to connect the second capacitor to the addition and subtraction unit, during each period of the first period and the second period.

17. The delta-sigma modulator according to claim 7, wherein
the second feedback unit has
a second capacitor which is provided in parallel with the first capacitor, and accumulates the electric charge in accordance with the output signal,
a second polarity switching unit which causes a polarity of the second capacitor to be different between the first period and the second period, and
a second charging and discharging switching unit which performs switching regarding whether to charge the second capacitor according to the output signal, or to connect the second capacitor to the addition and subtraction unit, during each period of the first period and the second period.

18. The delta-sigma modulator according to claim 14, wherein
the second polarity switching unit sets the polarity of the second capacitor to be a same as the polarity of the first capacitor.

19. The delta-sigma modulator according to claim 14, wherein
during the first period, the second charging and discharging switching unit charges the second capacitor at a timing different from that of the first capacitor, and connects the second capacitor to the addition and subtraction unit at a timing different from that of the first capacitor.

20. The delta-sigma modulator according to claim 14, wherein
the first feedback unit has a third capacitor which accumulates the electric charge in accordance with the output signal,
the delta-sigma modulator further comprising:
a capacitance switching unit which performs switching regarding which of the first capacitor, the second capacitor, and the third capacitor is caused to function as a capacitor for any of the first feedback unit and the second feedback unit.

* * * * *